(12) United States Patent
Tsukuda

(10) Patent No.: US 12,412,823 B2
(45) Date of Patent: Sep. 9, 2025

(54) SEMICONDUCTOR DEVICE

(71) Applicant: RENESAS ELECTRONICS CORPORATION, Tokyo (JP)

(72) Inventor: Tatsuaki Tsukuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 461 days.

(21) Appl. No.: 17/872,543

(22) Filed: Jul. 25, 2022

(65) Prior Publication Data

US 2023/0062318 A1 Mar. 2, 2023

(30) Foreign Application Priority Data

Aug. 31, 2021 (JP) ................................. 2021-141285

(51) Int. Cl.
*H01L 23/498* (2006.01)
*H01L 23/00* (2006.01)

(52) U.S. Cl.
CPC .. *H01L 23/49833* (2013.01); *H01L 23/49805* (2013.01); *H01L 23/49811* (2013.01); *H01L 23/49883* (2013.01); *H01L 24/45* (2013.01)

(58) Field of Classification Search
CPC .............................................. H01L 23/49811
See application file for complete search history.

(56) References Cited

U.S. PATENT DOCUMENTS

| 6,853,089 | B2 | 2/2005 | Ujiie et al. |
| 8,299,600 | B2 * | 10/2012 | Sato ........................ H01L 24/48 |
| | | | 257/692 |
| 10,204,849 | B2 | 2/2019 | Nakamura et al. |
| 2017/0317016 | A1 * | 11/2017 | Heinrich ................. H01L 24/92 |
| 2019/0311975 | A1 * | 10/2019 | Choi .................... H01L 23/3107 |

FOREIGN PATENT DOCUMENTS

| JP | 2003-092374 A | 3/2003 |
| JP | 2006-032632 A | 2/2006 |
| JP | 2010-123873 A | 6/2010 |
| JP | 2018-121035 A | 8/2018 |

OTHER PUBLICATIONS

Office Action dated Oct. 1, 2024, from corresponding Japanese Patent Application No. 2021-141285.

* cited by examiner

*Primary Examiner* — Yu-Hsi D Sun
(74) *Attorney, Agent, or Firm* — Rimon P.C.

(57) ABSTRACT

A performance of a semiconductor device is improved. The semiconductor device includes a semiconductor chip, and a clip mounted on the semiconductor chip via a silver paste. Here, the semiconductor chip includes a passivation film having an opening, a source pad of a main transistor having a portion exposed from the passivation film at the opening, and a wall portion provided on the passivation film so as to surround the source pad in a plan view. At this time, a whole of the portion (exposed surface) of the source pad, which is exposed from the passivation film, is covered with the silver paste. Further, in the plan view, the silver paste connecting the source pad with the clip is positioned inside of an area surrounded by the wall portion, without overflowing.

17 Claims, 25 Drawing Sheets

SENSE RATIO = 5000mΩ : 1mΩ
= 5000

SENSE RATIO = 5002mΩ  3mΩ
= 1667

SEMICONDUCTOR DEVICE

CROSS-REFERENCE TO RELATED APPLICATION

This disclosure of Japanese Patent Application No. 2021-141285 filed on Aug. 31, 2021 including the specification, drawings and abstract is incorporated herein by reference in its entirety.

BACKGROUND

The present invention relates to a semiconductor device, for example, to effective techniques applied to a semiconductor device as a component of an inverter.

There are disclosed techniques listed below.
[Patent Document 1] Japanese Unexamined Patent Application Publication No. 2018-121035
[Patent Document 2] Japanese Unexamined Patent Application Publication No. 2003-92374

Patent Document 1 describes a technique related to a package structure of a semiconductor device as a component of an inverter.

Patent Document 2 discloses a technique of suppressing the outflow of an adhesive for bonding a wiring substrate and a semiconductor chip by providing a groove in a solder resist formed on a surface of the wiring substrate.

SUMMARY

For example, as a semiconductor device for sealing a semiconductor chip power transistor is formed, there is a semiconductor device for connecting a pad formed on the surface of the lead and the semiconductor chip by a plate-like member called a clip. In this semiconductor device, the pad and the clip are connected by an adhesive, and solder is generally used as the adhesive.

However, for the purpose of improving the connection reliability between the pad and the clip and reducing the on-resistance, an adhesive called "silver paste" in which silver particles are mixed with epoxy resin, for example, is sometimes used instead of solder.

In this regard, the inventors of the present invention have newly found that the "silver paste" has a property of having a viscosity lower than that of solder, and due to this property, there is room for improvement which is not manifested in solder. Therefore, in semiconductor devices using "silver paste", it is desired to devise to overcome the room for improvement newly found.

A semiconductor device according to an embodiment includes a semiconductor chip and a clip mounted on the semiconductor chip via a silver paste. Here, the semiconductor chip has a passivation film having an opening, a pad having a portion exposed from the opening, and a wall portion provided on the passivation film so as to surround the pad in a plan view. At this time, a whole of the portion of the surface of the pads, which is exposed from the passivation film is covered with the silver paste. Also, the silver paste connecting the pad and the clip is positioned inside of the area surrounded by the wall portion without overflowing in a plan view.

According to an embodiment, it is possible to improve the performance of the semiconductor device.

BRIEF DESCRIPTIONS OF THE DRAWINGS

DETAILED DESCRIPTION

Figure 1:
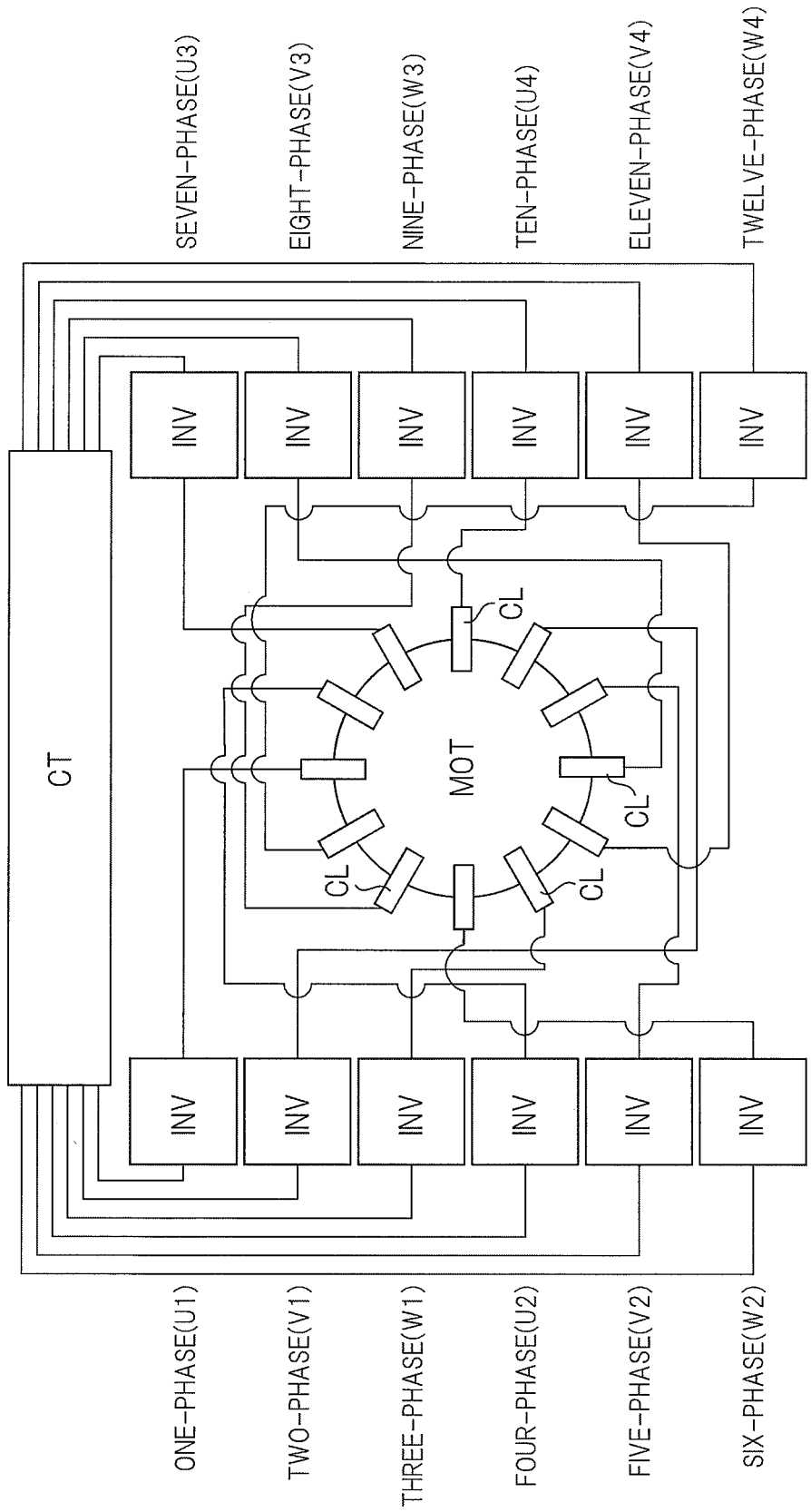
FIG. 1 is a diagram schematically illustrating a configuration of a 12-phase brushless DC motor control system.

In all the drawings for explaining an embodiment, the same members are denoted by the same reference numerals in principle, and repetitive descriptions thereof are omitted. Incidentally, there is a case to attach the hatching even in the plan view for clarity of the drawings.

<12-Phase Brushless DC Motor Control System>

Recently, in anticipation of functional safety toward practical application of automatic driving of automobiles, a conventional three-phase brushless DC motor, design development of a brushless DC motor of 6-phase or 12-phase has been carried out. Brushless DC motors are generally recognized to be complex in control because they are not self-rectifying. Therefore, in the six-phase brushless DC motor control system for controlling the brushless DC motor of the six-phase, two sets of conventional three-phase (U-phase, V-phase, W-phase), the 12-phase brushless DC motor control system for controlling the brushless DC motor of the 12-phase, the conventional three-phase (U-phase, V-phase, W-phase) is used as four sets so as not to immediately become apparent, even if a problem occurs in a set.

As a circuit for controlling each phase, an inverter circuit is used, AC power supplied from the inverter circuit is supplied to the coils of each phase of the brushless DC motor. Therefore, in the brushless DC motor control system for controlling the 6-phase brushless DC motor or 12-phase brushless DC motor, six or twelve inverter circuits are used.

FIG. 1 is a diagram schematically illustrating a configuration of a 12-phase brushless DC motor control system.

A motor MOT illustrated in FIG. 1 is a 12-phase brushless DC motor, and has twelve coils CL. Each coil CL is connected to the inverter circuit INV, respectively. That is, for each of the twelve coils the motor MOT has, the inverter circuit INV is provided. Therefore, the 12-phase brushless DC motor control system illustrated in FIG. 1 has a total of 12 inverter circuits INV. Each inverter circuit INV is connected to a control circuit CT provided in the MCU (Micro Controller Unit), each inverter circuit is controlled by the control circuit CT. Then, from each inverter circuit INV controlled by the control circuit CT, as the result of AC power that is supplied to the coil CL connected to the respective inverter circuit INV, the motor MOT is driven.

<Configuration of Inverter Circuit>

Next, a description will be given of a circuit configuration of the inverter circuit INV that is a component of the 12-phase brushless DC motor control system described above.

Figure 2:
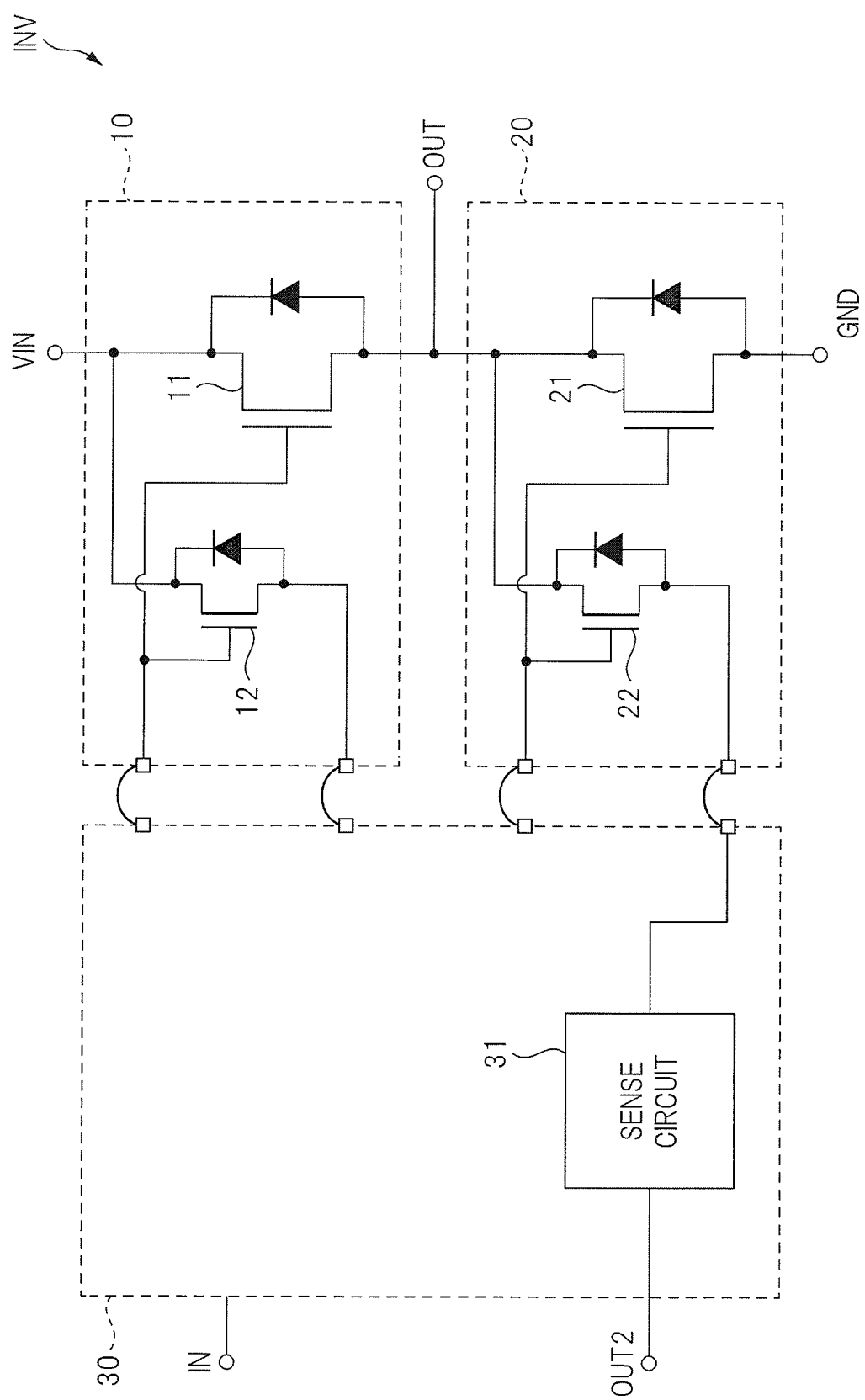
FIG. 2 is a diagram illustrating a circuit configuration of an inverter circuit.

FIG. 2 is a diagram illustrating a circuit configuration of an inverter circuit INV.

In FIG. 2, the inverter circuit INV includes a high-side switching circuit 10, a low-side switching circuit 20, and a control circuit 30.

The high-side switching circuit 10 includes a main transistor 11 made of a power transistor, and a sense transistor 12.

On the other hand, the low-side switching circuit 20 includes a main transistor 21 made of a power transistor, and a sense transistor 22.

In the high-side switching circuit 10 and the low-side switching circuit 20 configured in this way, the main transistor 21 included in the main transistor 11 and the low-side switching circuit 20 included in the high-side switching circuit 10 is connected in series between a power supply potential VIN and a ground potential GND.

Then, in FIG. 2, the connection node between the main transistor 11 and the main transistor 21 is "OUT", the connection node is connected to the coil CL shown in FIG. 1.

Subsequently, the control circuit 30 includes, for example, a pre-driver for applying a gate voltage to the gate electrode of the sense transistor 12 and the gate electrode of the main transistor 11 and a pre-driver for applying a gate voltage to the gate electrode of the main transistor 21 and the gate electrode of the sense transistor 22. Further, the control circuit 30 has a sense circuit 31 which is electrically connected to the sense transistor 22 included in the low-side switching circuit 20.

Then, in FIG. 2, the input node for inputting a control signal from the control circuit CT illustrated in FIG. 1 to the control circuit 30 is "IN", the output node for outputting an output signal from the sense circuit 31 of the control circuit 30 is "OUT2". The output node is electrically connected to the control circuit CT illustrated in FIG. 1. In this way, the inverter circuit INV is configured.

The control circuit 30 is configured to, based on a control signal from the control circuit CT illustrated in FIG. 1, control on/off of the main transistor 11 included in the high-side switching circuit 10, and also to control on/off of the main transistor 21 included in the low-side switching circuit 20. That is, the control circuit 30 controls the on/off of the main transistor 11 by switching the gate voltage applied to the gate electrode of the main transistor 11, and also controls the on/off of the main transistor 21 by switching the gate voltage applied to the gate electrode of the main transistor 21.

In this way, an AC power is supplied from the connection node ("OUT") between the main transistor 11 and the main transistor 21 to the coil CL illustrated in FIG. 1 by the on/off control of the main transistor 11 and the on/off control of the main transistor 21.

Here, the sense transistor 22 included in the low-side switching circuit 20 is provided to detect the current value of the current flowing through the main transistor 21.

For example, the main transistor 21 and the sense transistor 22 constitute a current mirror circuit so that the current value of the current flowing through the main transistor 21:the current value of the current flowing through the sense transistor 22=12500:1 (sense ratio).

Then, the sense transistor 22 is electrically connected to the sense circuit 31, the current flowing through the sense transistor 22, after being changed to a voltage in the sense circuit 31 is output from the "OUT2" being an output node to the control circuit CT illustrated in FIG. 1. At this time, in the control circuit CT illustrated in FIG. 1, based on the voltage signal input from the "OUT2" and the "sense ratio", the current value of the current flowing through the main transistor 21 is calculated.

As described above, the inverter circuit INV is configured.

<Package Structure>

Subsequently, a description will be given of a mounting configuration of the inverter circuit INV.

Figure 3:
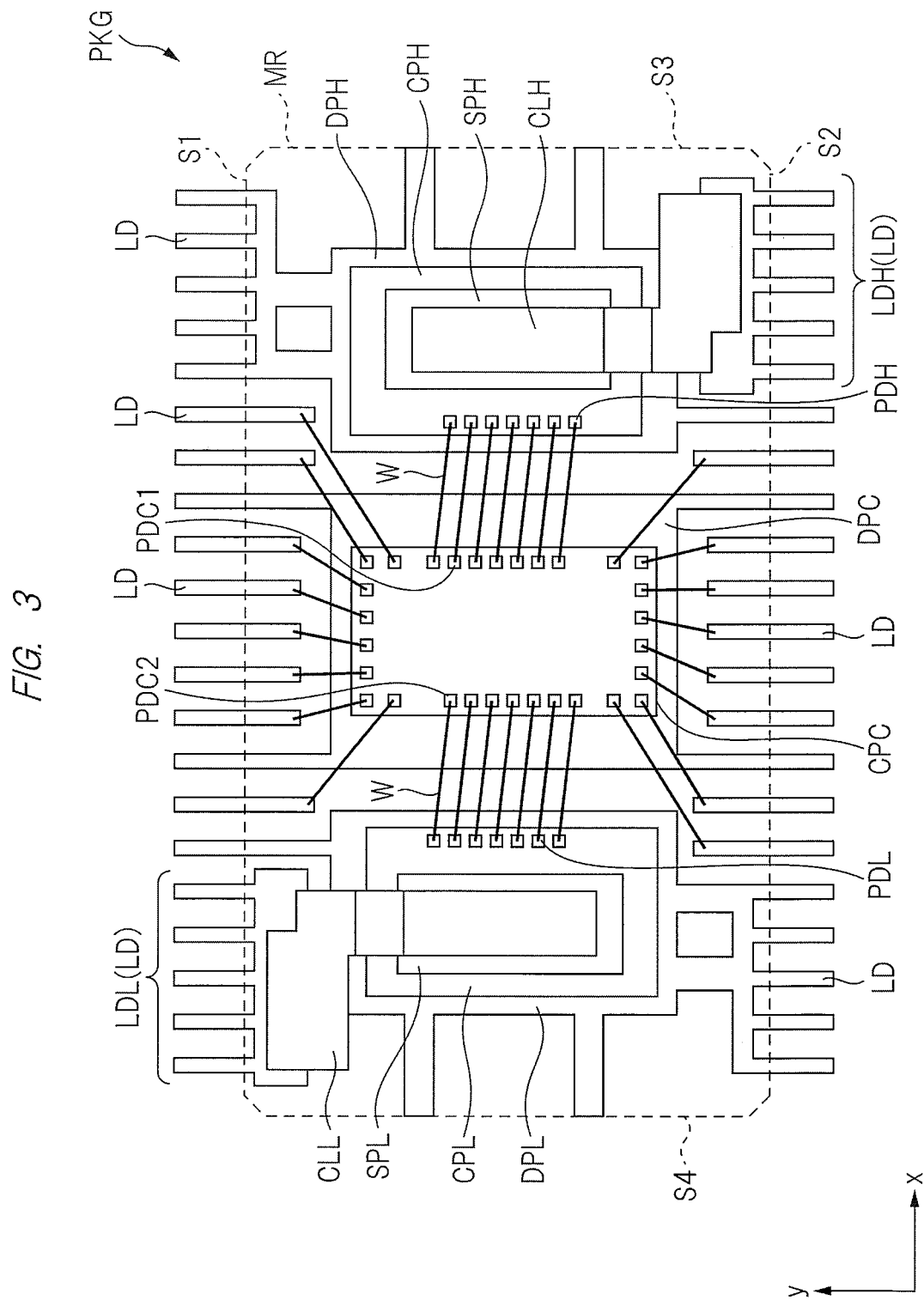
FIG. 3 is a diagram illustrating a mounting configuration of a semiconductor device for realizing an inverter circuit.

FIG. 3 is a diagram illustrating a mounting configuration of a semiconductor device PKG for realizing an inverter circuit.

In FIG. 3, the semiconductor device PKG has a sealing body MR having a rectangular planar shape. The sealing body MR has a side S1 which is a long side, a side S2 which opposes the side S1, a side S3 which is a short side intersecting the side S1 and the side S2, and a side S4 which opposes the side S3. Leads LDs protrude from the long side S1 and the long side S2.

In FIG. 3, the outline of the sealing body MR is indicated by a broken line, and the components sealed inside the sealing body MR are illustrated. Hereinafter, the internal configuration of the sealing body MR will be described.

The semiconductor device PKG has a die pad DPC which is a chip mounting portion, a die pad DPL which is a chip mounting portion, and a die pad DPH which is a chip mounting portion. Specifically, the die pad DPL, the die pad DPC and the die pad DPH are arranged so as to be aligned in the x direction in this order. In other words, the die pad DPL is disposed on the left side, and the die pad DPC is disposed in the central portion, and the die pad DPH is disposed on the right side.

On the die pad DPC, a semiconductor chip CPC is mounted. The semiconductor chip CPC, the control circuit 30 illustrated in FIG. 2 is formed. A plurality of pads including, for example, a plurality of pads PDC1 and a plurality of pads PDC2 are formed on the surface of the semiconductor chip CPC. Thus, at the central portion of the semiconductor device PKG, the semiconductor chip CPC mounted on the die pad DPC is disposed.

Next, on the die pad DPL, the semiconductor chip CPL is mounted. On the semiconductor chip CPL, the low-side switching circuit 20 illustrated in FIG. 2 is formed. That is, on the semiconductor chip CPL, the main transistor 21 and the sense transistor 22 constituting the low-side switching circuit 20 are formed. These main transistors 21 and the sense transistor 22 are composed of a vertical trench power transistor for flowing a current in the thickness direction of the semiconductor chip CPL. Then, on the surface of the semiconductor chip CPL, together with the source pad SPL for the main transistor, a plurality of pads PDL are formed. The plurality of pads PDL include a source pad for a sense transistor, a gate pad common to the main transistor 21 and the sense transistor 22, and the like.

Further, as illustrated in FIG. 3, on the source pad SPL for the main transistor, the clip CLL which is a plate-like member made of copper is disposed. As illustrated in FIG. 3, the clip CLL is electrically connected to the lead LDL. On the other hand, each of the plurality of pads PDL is electrically connected with each of the plurality of pad PDC2 formed on the surface of the semiconductor chip CPC by the bonding wire W.

Subsequently, the semiconductor chip CPH is mounted on the die pad DPH. On the semiconductor chip CPH, the high-side switching circuit 10 illustrated in FIG. 2 is formed. That is, the semiconductor chip CPH, the main transistor 11 and the sense transistor 12 constituting the high-side switching circuit 10 are formed. These main transistors 11 and sense transistor 12 are composed of a vertical trench power transistor for passing a current in the thickness direction of the semiconductor chip CPH. Then, on the surface of the semiconductor chip CPH, together with the source pad SPH for the main transistor, a plurality of pads PDH are formed. The plurality of pads PDH includes a source pad for a sense transistor, a gate pad common to the main transistor 11 and the sense transistor 12, and the like.

Further, as illustrated in FIG. 3, on the source pad SPH for the main transistor, the clip CLH which is a plate-like member made of copper is disposed. As illustrated in FIG. 3, the clip CLH is electrically connected to the lead LDH. On the other hand, each of the plurality of pads PDH is electrically connected with each of the plurality of pad PDC1 formed on the surface of the semiconductor chip CPC by the bonding wire W.

In the present embodiment, as illustrated in FIG. 3, the planar shape of the semiconductor device PKG is a substantially rectangular shape, specifically, a rectangular shape in which each corner portion is chamfered. Further, in the present embodiment, the planar shape of each semiconductor chip is, as illustrated in FIG. 3, a rectangle. Then, in this embodiment, as illustrated in FIG. 3, so that the short side of each semiconductor chip is along the long side of the semiconductor device PKG, the semiconductor chip CPC, the semiconductor chip CPL and the semiconductor chip CPH are arranged. Thus, the size of each semiconductor chip and the size of the semiconductor device PKG is reduced.

In this embodiment, the semiconductor chip CPL on which the low-side switching circuit 20 is formed and the semiconductor chip CPH on which the high-side switching circuit 10 is formed are the same type of semiconductor chips to each other.

As described above, the semiconductor device PKG comprised of SiP (System in Package) that mounts the semiconductor chip CPC, the semiconductor chip CPL and the semiconductor chip CPH, which are formed configuring a circuit for the inverter circuit INV, is composed as one package structure.

<Utility of Silver Paste>

For example, the die pad and the semiconductor chip are bonded with an adhesive, and the main transistor source pad and the clip formed on the surface of the semiconductor chip are also bonded with an adhesive. At this time, solder is generally used as each adhesive.

However, in the present embodiment, "silver paste" in which silver particles are mixed with epoxy resin is used as an adhesive from the viewpoint of stress relaxation in the adhesive, improvement in reliability of connectivity, and reduction in on-resistance. Since this "silver paste" has a lower viscosity than solder, it has an advantage that peeling and generation of voids can be suppressed. Furthermore, since "silver paste" is useful in that generation of voids can be suppressed than solder, "silver paste" is used in place of solder as an adhesive material for connecting a die pad and a semiconductor chip or an adhesive material for connecting a source pad for a main transistor and a clip in this embodiment. In the present embodiment, the "void" is, for example, a crack (hereinafter, referred to as a "crack").

In particular, the present inventors have newly found that when a crack occurs in the adhesive material, the "sense ratio" indicating the ratio of the current value of the main transistor to the current value of the sense transistor is greatly changed. Then, when the "sense ratio" greatly changes, it becomes impossible to accurately estimate the current value of the main transistor from the current value of the sense transistor.

This point will be described below.

Figure 4:
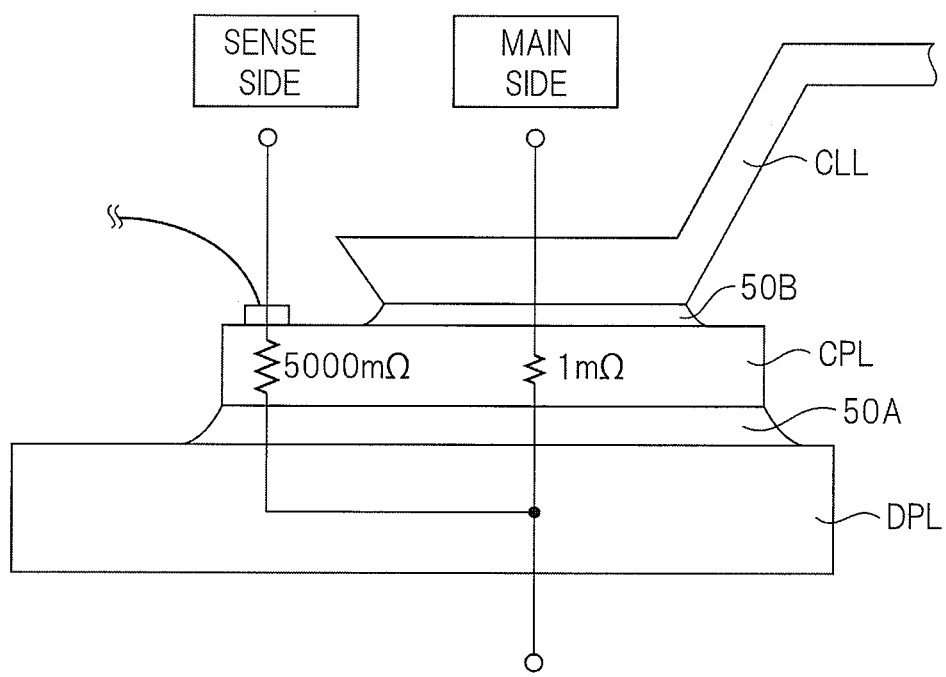
FIG. 4 is a schematic diagram for explaining a "sense ratio".

FIG. 4 is a schematic diagram for explaining the "sense ratio".

In FIG. 4, a semiconductor chip CPL is mounted on a die pad DPL, and the die pad DPL and the semiconductor chip CPL are bonded to each other by an adhesive 50A. A clip CLL is disposed on the semiconductor chip CPL, and the semiconductor chip CPL and the clip CLL are bonded to each other by an adhesive 50B.

Here, the "main-side" illustrated in FIG. 4 shows a current path of the die pad DPL→adhesive 50B→the main transistor formed on the semiconductor chip CPL→clip CLL formed in OOA adhesive material 50A. On the other hand, the "sense-side" illustrated in FIG. 4 shows a current path of the die pad DPL→adhesive 50A→the sense transistor formed on the semiconductor chip CPL→adhesive 50B→bonding wire.

In FIG. 4, while a large current flows through the main transistor, since a large current does not flow through the sense transistor, for example, while the resistance value caused by the main transistor is set to "1 mΩ", the resistance value caused by the sense transistor is set to "5000 mΩ". In this case, the "sense ratio" is "5000". That is, in the 12-phase brushless DC motor control system, based on the current value of the current flowing through the sense transistor (or converted voltage value) and the sense ratio (=5000), it is possible to estimate the current value of the current flowing through the main transistor. Therefore, from the viewpoint of accurately estimating the current value of the current flowing through the main transistor, it is important that the "sense ratio" is constant.

Figure 5:
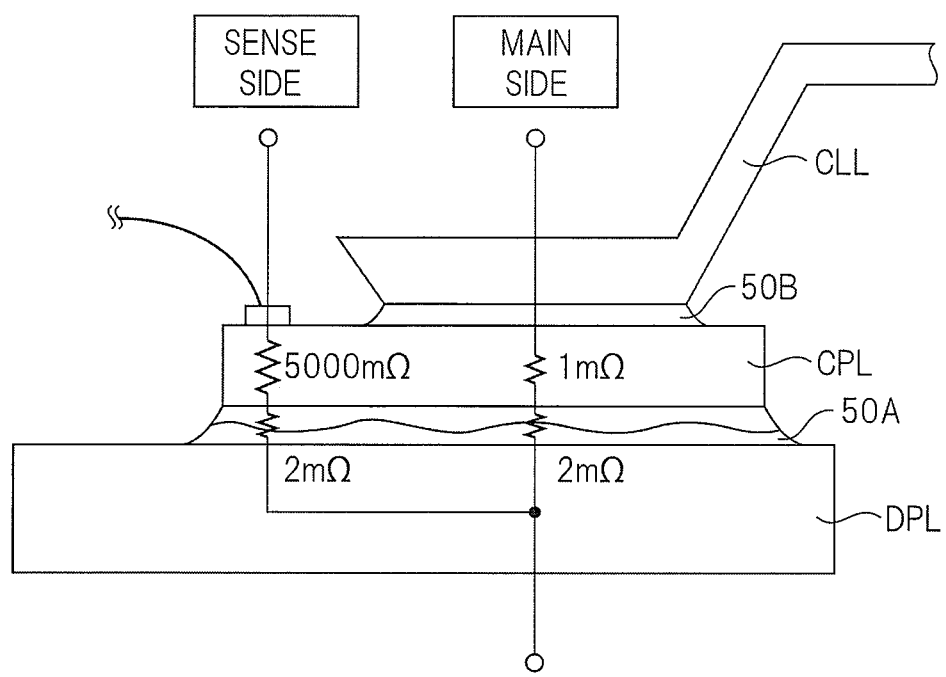
FIG. 5 is a diagram illustrating that the "sense ratio" is greatly changed when cracks occur in the adhesive.

In this regard, for example, if cracks occur in the adhesive 50A, the "sense-ratio" changes significantly. This will be explained with reference to FIG. 5. FIG. 5 is a diagram for explaining that the "sense ratio" changes greatly when a crack occurs in the adhesive 50A.

As illustrated in FIG. 5, when cracks occur in the adhesive 50A, a resistor due to cracks is applied. Specifically, a resistance value ("2 mΩ") caused by the crack is added in series in the current path ("main-side") of the die pad DPL→the main transistor formed on the semiconductor chip CPL→the adhesive 50A→the clip CLL formed on adhesive 50A. On the other hand, in the current path ("sense-side") of the die pad DPL→adhesive 50A→the sense transistor formed on the semiconductor chip CPL→adhesive 50B→bonding wire, the resistance value caused by the crack ("2 mΩ") is added in series.

As a result, the "sense ratio" greatly decreases from "5000" to "1667". That is, when cracks occur in the adhesive 50A, the "sense ratio" changes greatly. This means that in the 12-phase brushless DC motor control system, it becomes difficult to accurately estimate the current value of the current flowing through the main transistor.

In particular, when the adhesive 50A and the adhesive 50B are formed of solder, the "sense ratio" is greatly changed by the crack because the solder is likely to be cracked. That is, when the adhesive material 50A and the adhesive material 50B is composed of solder, by the generation of cracks, there is a high possibility that it is impossible to accurately estimate the current value of the current flowing through the main transistor. In this regard, when the adhesive 50A and the adhesive 50B are composed of "silver paste" rather than solder, considering that "silver paste" is less likely to crack than solder, according to "silver paste", it is considered that a large change in "sense ratio" caused by cracks can be suppressed. That is, it can be said that "silver paste" is useful in that it can reduce the potential that the occurrence of cracks makes it impossible to accurately estimate the current value of the current flowing through the main transistor.

<Room for Improvement in Silver Paste>

As described above, "silver paste" is less likely to crack than solder, it is useful in that it can suppress the change in the "sense ratio" caused by the crack. However, according to studies by the present inventor, there is room for improvement shown below in "silver paste"

Figure 6:
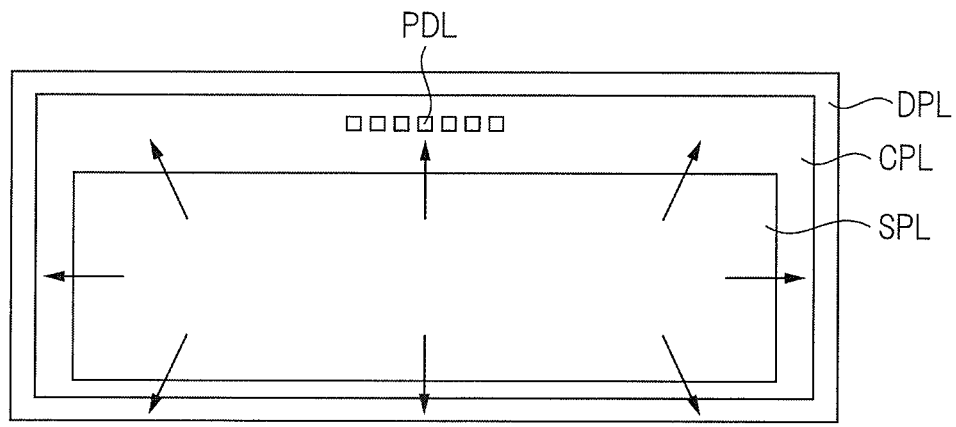
FIG. 6 is a diagram for explaining a room for improvement existing in the silver paste.

FIG. 6 is a diagram for explaining a room for improvement existing in the "silver paste".

In FIG. 6, on the die pad DPL, a semiconductor chip CPL is mounted, on the surface of the semiconductor chip CPL, a source pad SPL for the main transistor, a plurality of pads PDL are formed. Then, after applying a "silver paste" on the source pad SPL for the main transistor illustrated in FIG. 6, a clip is disposed on the source pad SPL for the main transistor through this "silver paste". That is, the source pad SPL and the clip for the main transistor is connected by a "silver paste".

Here, as illustrated in FIG. 6, when the "silver paste" is applied on the source pad SPL for the main transistor, due to the fact that the viscosity of the "silver paste" is lower than that of the solder, the "silver paste" protrudes and spreads out from the inside of the source pad SPL for the main transistor. Therefore, for example, when the "silver paste" protruding from the source pad SPL for the main transistor reaches the plurality of pads PDL, the source pad SPL for the main transistor and the pad PDL are short-circuited through the "silver paste". Furthermore, when the "silver paste" is nulled from the surface of the semiconductor chip CPL and falls onto the die pad DPL, the "silver paste" causes the die pad DPL and the source pad SPL for the main transistor to short-circuit. In other words, the source and drain of the main transistor formed in the semiconductor chip CPL is short-circuited. Therefore, in order to suppress the protrusion of the "silver paste" from the source pad SPL for the main transistor, there is a related art described below.

DESCRIPTION OF RELATED ART

The term "related art" as used herein is not a known technique, but is a technique having a problem found by the present inventor and is a technique which is a prerequisite of the present invention.

Figure 7:
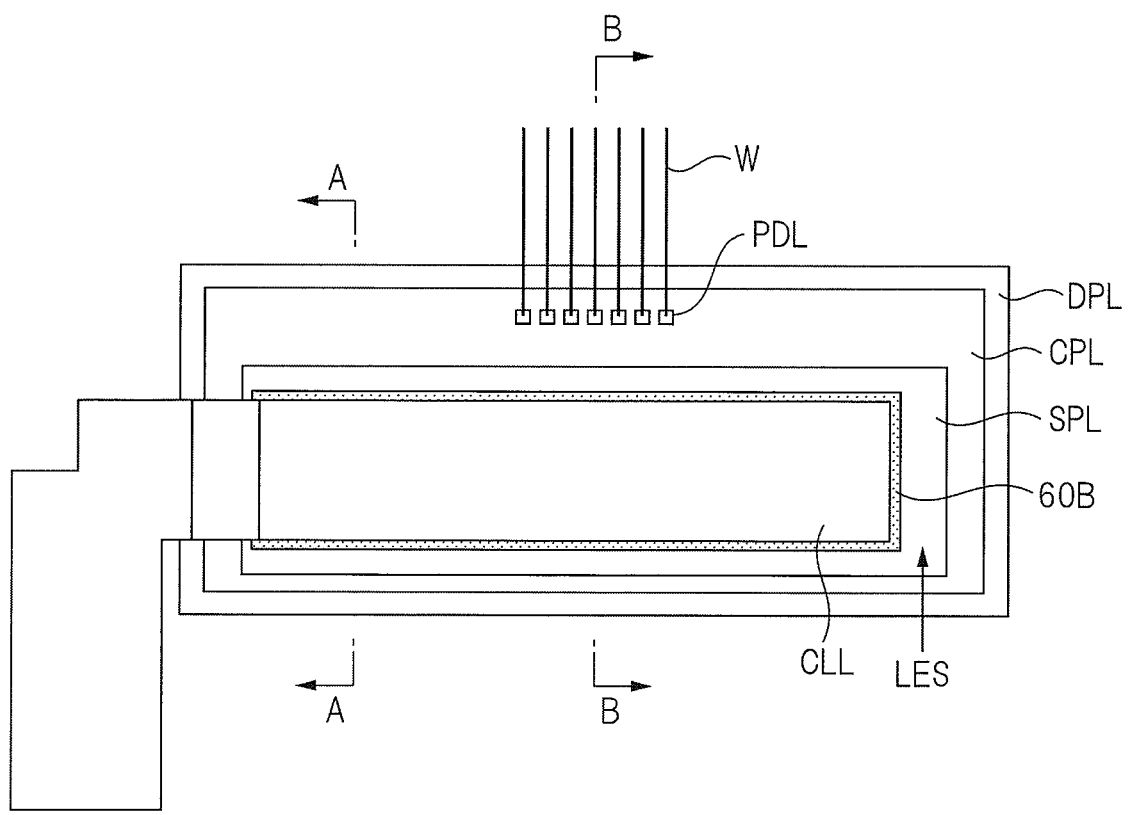
FIG. 7 is a diagram for explaining a related art.

FIG. 7 is a diagram for explaining the related art.

In FIG. 7, on the die pad DPL, the semiconductor chip CPL is mounted, on the surface of the semiconductor chip CPL, the source pad SPL for the main transistor and a plurality of pads PDL are formed. On the source pad SPL for the main transistor, the clip CLL is disposed via a silver paste 60B. On the other hand, each of the plurality of pads PDL is electrically connected to the wire W.

Figure 8:
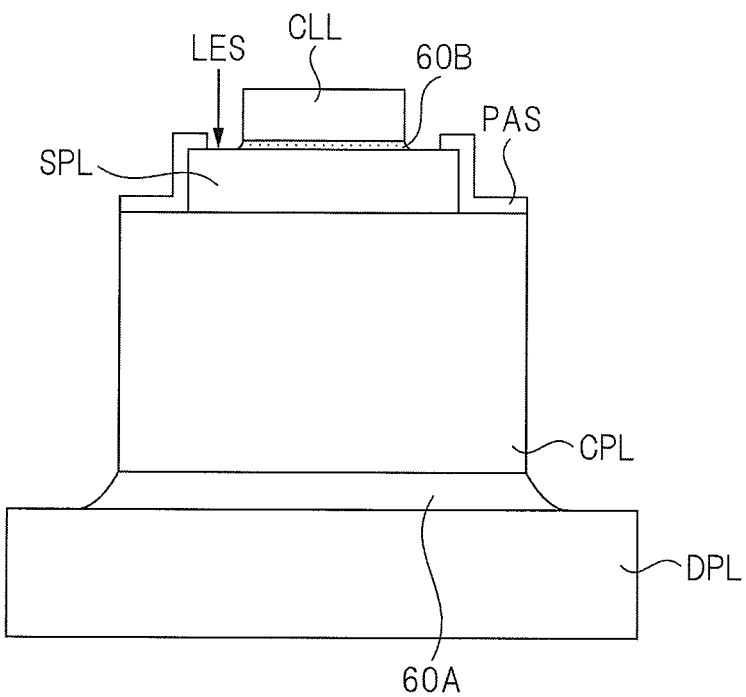
FIG. 8 is a cross-sectional view taken along a line A-A in FIG. 7.

FIG. 8 is a cross-sectional view taken along a line A-A in FIG. 7.

In FIG. 8, the die pad DPL and the semiconductor chip CPL are connected by the silver paste 60A. Then, on the surface of the semiconductor chip CPL, for example, 1) silicon oxide film, 2) silicon nitride film, or 3) passivation film consisting of a laminated film of silicon oxide film and silicon nitride film (surface protective film) PAS is formed, and in the passivation film PAS, an opening is formed.

At this time, from the opening, a portion of the source pad SPL for the main transistor, that is, a portion of the exposed surface LES of the source pad SPL for the main transistor exposed from the passivation film PAS is exposed, and on the exposed source pad SPL for the main transistor, the clip CLL is mounted via a silver paste 60B.

Here, in the related art, as illustrated in FIG. 7, in order to suppress the silver paste 60B protrudes and spreads from within the source pad SPL for the main transistor, the silver paste 60B is applied only to the minimum area required for connecting with the clip CLL. As a result, as illustrated in FIGS. 7 and 8, a part of the exposed surface LES of the main transistor source pad SPL exposed from the passivation film PAS is not covered with the silver paste 60B, but is exposed from the silver paste 60B. Thus, according to the related art, since the silver paste 60B is applied only to the required minimum area, it is possible to suppress the silver paste 60B from extruding and spreading from the inside of the source pad SPL for the main transistor.

In this regard, since the present inventor has newly found that there is room for improvement in the related art from the viewpoint of suppressing the change in the "sense ratio", this finding will be described below.

<Room for Improvement Existing in the Related Art>

The present inventor has found a novel finding that the "sense ratio" changes depending on the position of the clip. This finding will be explained with reference to the drawings.

Figure 9:
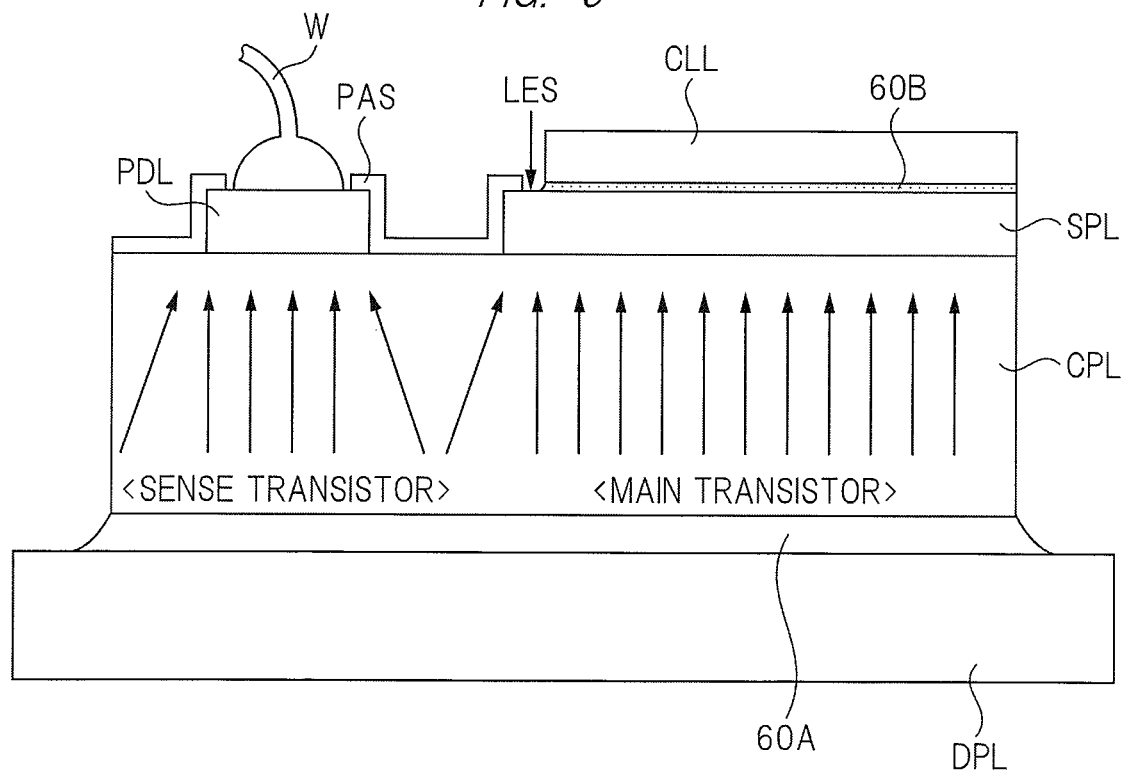
FIG. 9 is a diagram illustrating a configuration in which a clip is disposed being shifted to the left side of the paper.

FIG. 9 is a diagram illustrating a configuration in which the clip CLL is arranged to be shifted to the left side in the drawing.

In FIG. 9, on the semiconductor chip CPL, although the vertical trench power transistor for passing a current in the thickness direction of the semiconductor chip CPL is formed, in the present drawings not only FIG. 9, the illustration of the trench gate structure of the vertical trench power transistor is omitted.

Here, in the assembly process of the semiconductor device, although the clip CLL is mounted via a silver paste 60B on the source pad SPL for the main transistor of the semiconductor chip CPL, the mounting position of the clip CLL may vary by the semiconductor device. As a result, the "sense ratio" changes depending on the position of the clip.

For example, as illustrated in FIG. 9, when the clip CLL is disposed shifted to the left side of the paper plane, the current flowing through the main transistor increases, while the current flowing through the sense transistor decreases. As a result, the "sense ratio" increases. In other words, when the clip CLL is positioned shifted to the left side of the paper plane, the resistance value of the main transistor decreases, while the resistance value of the sense transistor increases, resulting in an increase in the "sense ratio".

Figure 10:
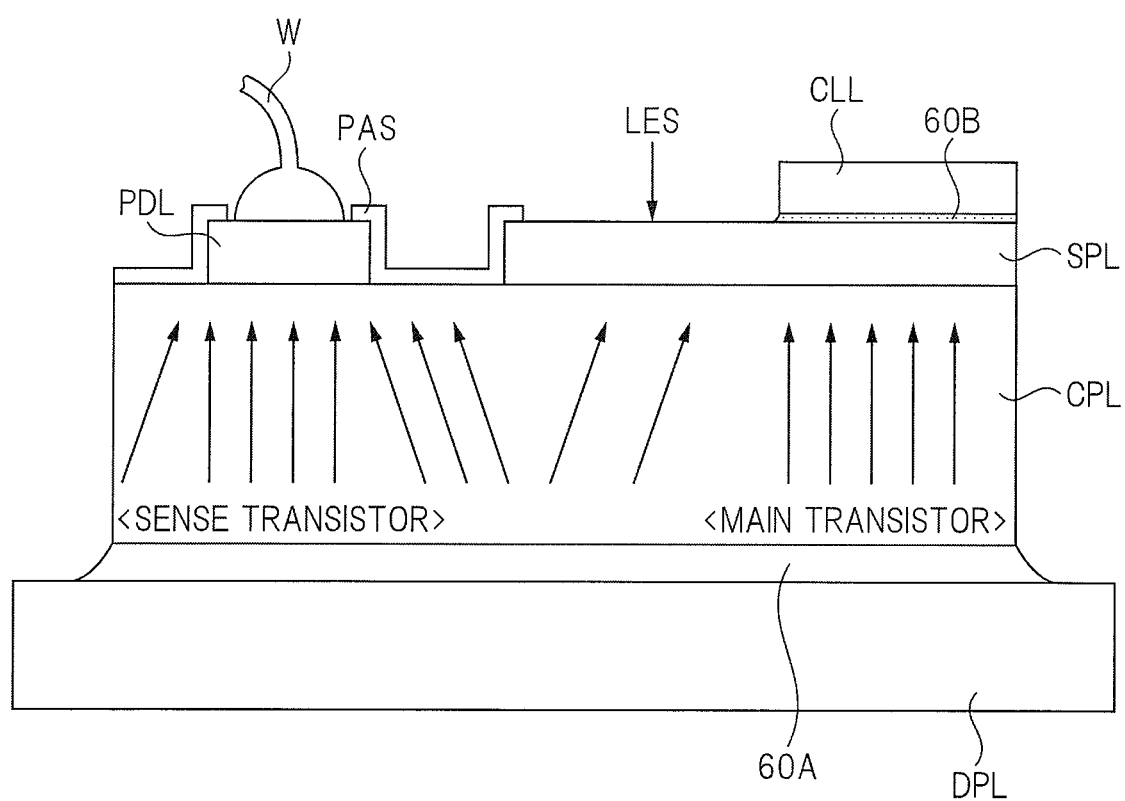
FIG. 10 is a diagram illustrating a configuration in which the clip is disposed being shifted to the right side of the paper surface.

In contrast, as illustrated in FIG. 10, when the clip CLL is disposed to be shifted to the right side of the paper plane, while the current flowing through the main transistor is reduced, the current flowing through the sense transistor is increased. As a result, the "sense ratio" decreases. In other words, when the clip CLL is positioned to the right of the paper plane, the resistance value of the main transistor increases, while the resistance value of the sense transistor decreases, resulting in a decrease in the "sense ratio".

Thus, it can be seen that the "sense ratio" changes depending on the position of the clip. In this regard, from the viewpoint of accurately estimating the current value of the current flowing through the main transistor, it is undesirable that the "sense ratio" changes depending on the position of the clip, and it is desirable that the "sense ratio" becomes substantially constant even if the positional deviation of the clip occurs. That is, there is room for improvement in the related art from the viewpoint of suppressing a change in the "sense ratio" caused by a positional deviation of the clip. Therefore, in the present embodiment, a contrivance is made to overcome the room for improvement existing in the related art. Hereinafter, the technical idea of the present embodiment to which the present invention is applied will be described.

Technical Concept in Embodiments

Figure 11:
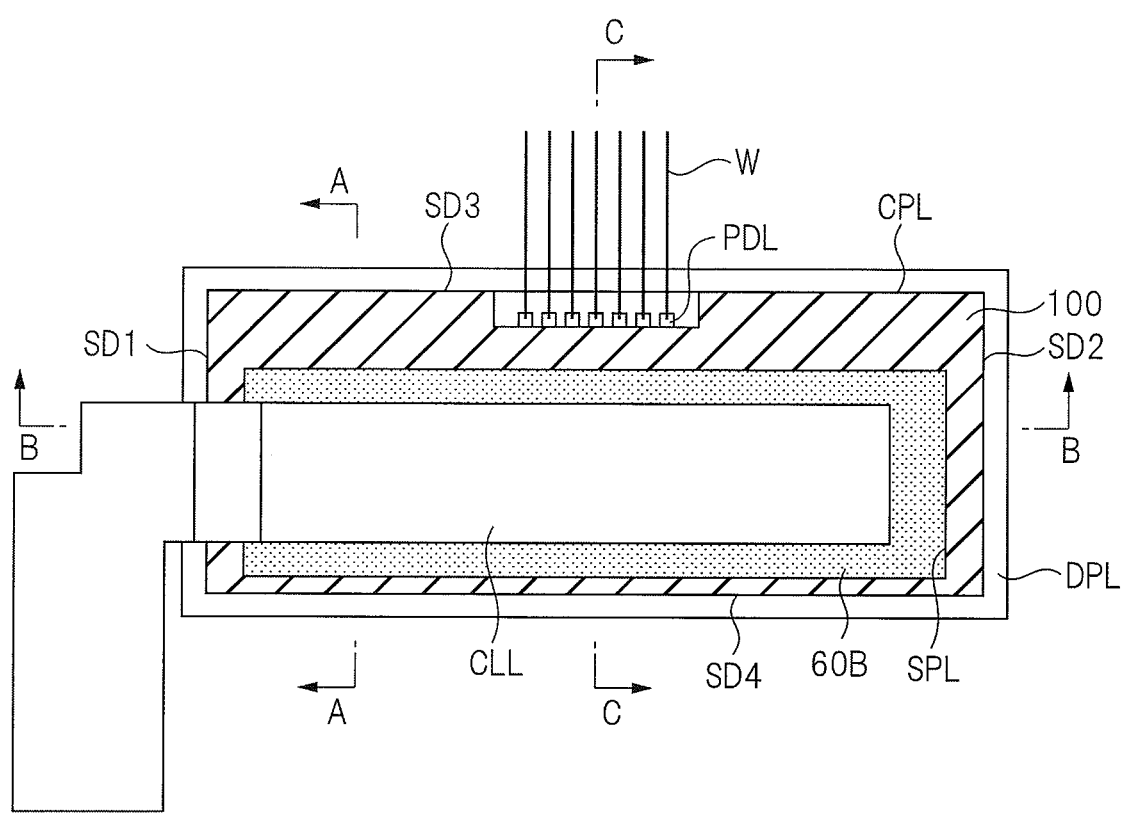
FIG. 11 is a diagram for explaining a technical philosophy in an embodiment.

FIG. 11 is a diagram for explaining a technical idea in the present embodiment.

In FIG. 11, on the die pad DPL, the semiconductor chip CPL is mounted. On the surface of the semiconductor chip CPL, a source pad SPL for the main transistor and a plurality of pads PDL are formed. The source pad SPL for the main transistor is electrically connected to the clip CLL. On the other hand, each of the plurality of pads PDL is electrically connected to the bonding wire W.

Here, to the semiconductor chip CPL, a main transistor for passing a current and a sense transistor provided for detecting the current value of the current flowing through the main transistor are formed. The main transistor and the sense transistor are composed of vertical trench power transistors which flow current in the thickness direction of the semiconductor chip CPL.

The vertical trench power transistor, for example, is composed of a power MOSFET (Metal Oxide Semiconductor Field Effect Transistor), but is not limited thereto, may be composed of a IGBT (Insulated Gate Bipolar Transistor). That is, the main transistor and the sense transistor are composed of a power transistor represented by a power MOSFET or an IGBT.

However, in the following, it is assumed that the main transistor and the sense transistor are composed of powered MOSFET. In this case, each of the main transistor and the sense transistor has a source, a drain and a gate electrode.

In particular, focusing on the main transistor, the source of the main transistor is electrically connected to the source pad SPL for the main transistor is formed on the surface of the semiconductor chip CPL. On the other hand, the drain of the main transistor is electrically connected to the drain electrode formed on the back surface of the semiconductor chip CPL, and the drain electrode is electrically connected to the die pad DPL.

Further, focusing on the sense transistor, the source of the sense transistor is electrically connected to the source pad for the sense transistor that is one of a plurality of pads PDL formed on the surface of the semiconductor chip CPL. On the other hand, the drain of the sense transistor is common to the drain of the main transistor.

Furthermore, the main transistor of the gate electrode and the gate electrode of the sense transistor are electrically connected and also electrically connected to the gate pad which is another one of a plurality of pads PDL formed on the surface of the semiconductor chip CPL.

In FIG. 11, the semiconductor chip CPL in this embodiment, in the plan view, has a wall portion 100 formed so as to surround the source pad SPL for the main transistor. The region surrounded by the wall portion 100 is filled with a silver paste 60B, and the main transistor source pads SPL and the clip CLL is electrically connected to each other by the filled silver paste 60B. In other words, a whole of the surface LES of the main transistor source pad SPL, which is exposed from the passivation film PAS is covered with the silver paste 60B. Further, the silver paste 60B connecting the source pad SPL of the main transistor and the clip CLL, is in contact with the wall portion 100 and positioned inside of an area surrounded by the wall portion 100 in the plan view.

Here, as illustrated in FIG. 11, in the plan view, the main transistor source pad SPL and a plurality of pads PDL are separated by the wall portion 100. The wall portion 100 has a portion that overlaps each of the plurality of pads PDL in the planar manner.

Subsequently, as illustrated in FIG. 11, the planar shape of the semiconductor chip CPL has a rectangular shape, and the side SD1 is a short side, and the side SD2 facing the side SD1, and the side SD3 is a long side intersecting the side SD1 and the side SD2, and the side SD4 facing the side SD3. The extraction portion of the clip CLL intersects with the side SD1. That is, the clip CLL is extracted so as to intersect with the side SD1 of the semiconductor chip CPL.

Figure 12:
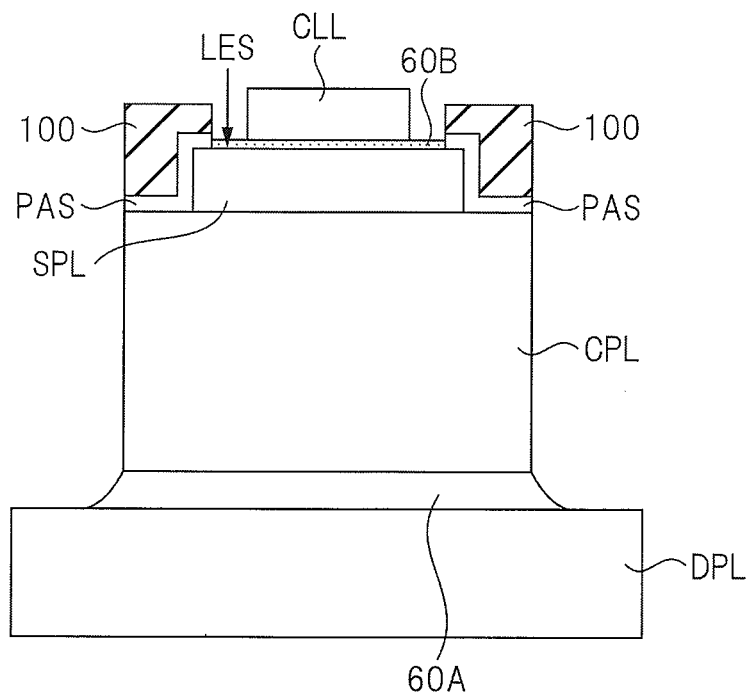
FIG. 12 is a cross-sectional view taken along a line A-A in FIG. 11.

FIG. 12 is a cross-sectional view taken along a line A-A in FIG. 11.

In FIG. 12, on the die pad DPL, the semiconductor chip CPL is mounted via a silver paste 60A. On the surface of the semiconductor chip CPL, the source pad SPL for the main transistor is formed, and, for example, a passivation film PAS made of a silicon oxide film or a silicon nitride film is formed. The passivation film PAS is provided with an opening, and the source pad SPL for the main transistor has a portion exposed from the opening (exposed surface LES). Then, as illustrated in FIG. 12, the wall portion 100 is provided on the passivation film PAS. The wall portion 100 is disposed so as to surround the source pad SPL for the main transistor in the plan view (see FIG. 11).

Here, on the surface of the main transistor source pad SPL surrounded by the wall portion 100, silver paste 60B is formed, and by the silver paste 60B, the source pad SPL for the main transistor and the clip CLL are electrically connected.

For example, the wall portion 100 is formed of an organic insulating film typified by a polyimide resin film. The clip CLL is made of copper.

Figure 13:
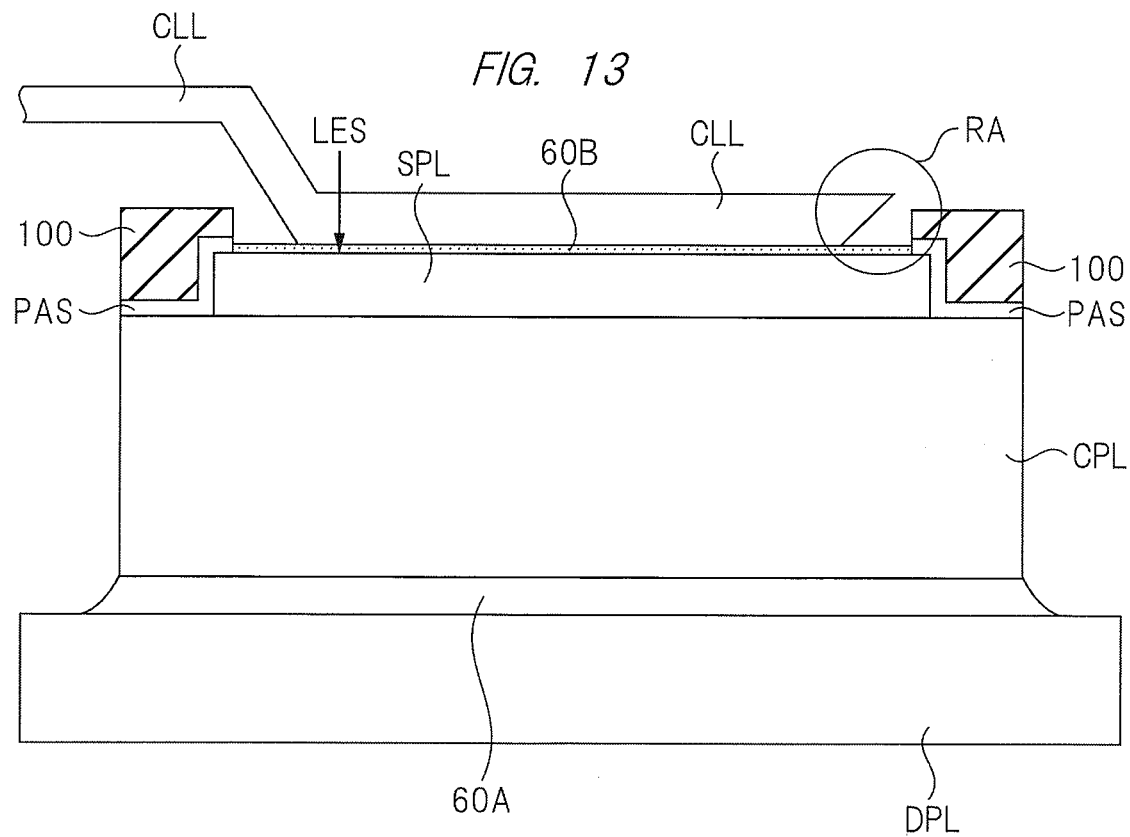
FIG. 13 is a cross-sectional view taken along a line B-B in FIG. 11.

FIG. 13 is a cross-sectional view taken along a line B-B in FIG. 11.

Also in FIG. 13, with the wall portion 100 is formed on the passivation film PAS, it can be seen that the clip CLL is mounted via a silver paste 60B on the source pad SPL for the main transistor. Here, if the thickness of the wall portion 100 is too thick, when the clip CLL has caused positional deviation, there is a possibility of interference. For example, as the thickness of the wall portion 100 is increased, the protrusion of the silver paste 60B can be more reliably suppressed, and therefore, from the viewpoint of suppressing the protrusion of the silver paste 60B, it is desirable to increase the thickness of the wall portion 100. In the present embodiment, as illustrated in FIG. 12, the thickness of the wall portion 100 is larger than the thickness of the passivation film PAS. On the other hand, if the thickness of the wall portion 100 is made too thick, it becomes difficult to secure a clearance against the positional deviation of the clip CLL. Therefore, an example in which the clearance between the clip CLL and the wall portion 100 is examined will be described below.

Figure 14:
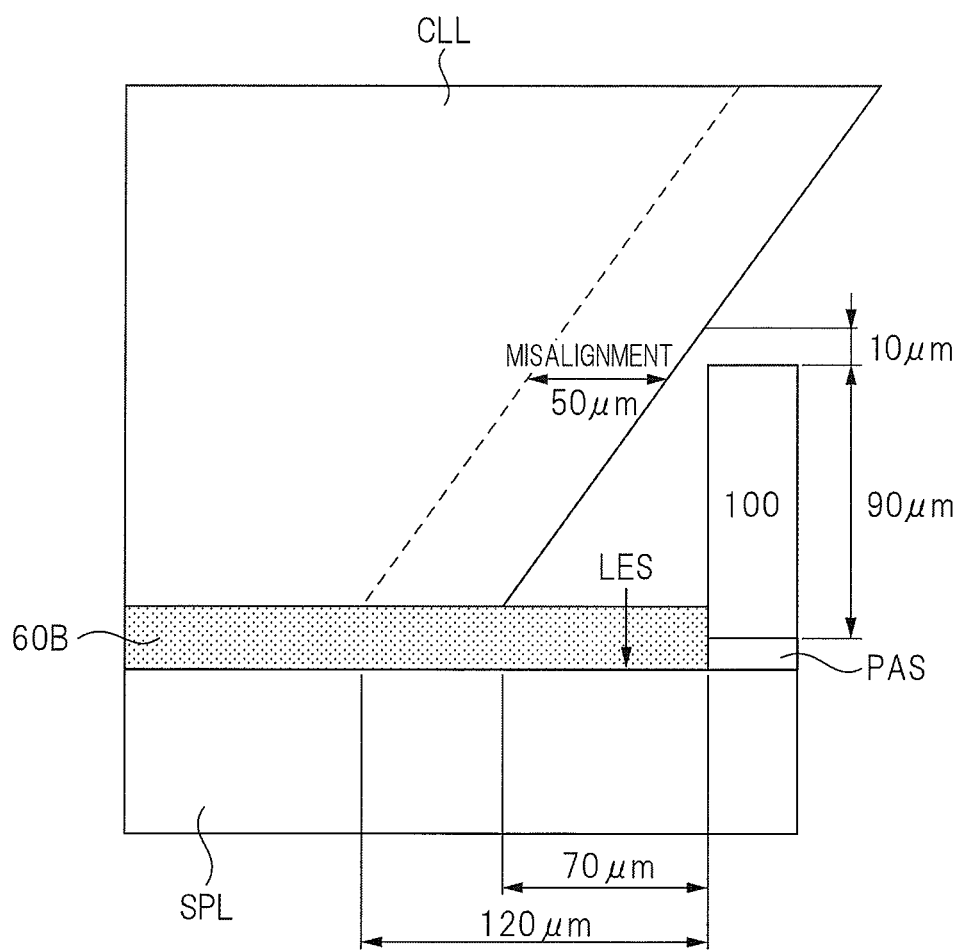
FIG. 14 is an enlarged view illustrating an enlarged portion in FIG. 13.

FIG. 14 is an enlarged view illustrating the region RA in FIG. 13 in an enlarged manner. As illustrated in FIG. 14, even when the positional deviation of the clip CLL is set to "50 μm", considering that to ensure a clearance of "10 μm" between the wall portion 100 and the clip CLL, it can be seen that the thickness of the wall portion 100 can be increased to about "90 μm". Thus, considering the clearance between the wall portion 100 and the clip CLL, the thickness of the wall portion 100, it can be seen that there is an allowable range. Therefore, in determining the thickness of the wall portion 100, rather than considering only the viewpoint of suppressing the protrusion of the silver paste 60B, it can be seen that it is also required to consider ensuring a clearance between the wall portion 100 and the clip CLL.

Features in Embodiment

Next, the characteristic points in the present embodiment will be described.

A feature in this embodiment, for example, as illustrated in FIG. 11, is that a wall portion 100 is provided so as to surround the source pad SPL for the main transistor. Thus, silver paste 60B supplied on the main transistor source pad SPL is positioned inside of an area surrounded by the wall portion 100, it becomes impossible to extend protruding outside the main transistor source pad SPL. As a result, it is possible to suppress the silver paste 60 having a low viscosity from reaching the plurality of pads PDL formed on the surface of the semiconductor chip CPL and from protruding from the semiconductor chip CPL and reaching the die pad DPL. Therefore, according to the present embodiment, through the silver paste 60B, it is possible to suppress the source pad SPL and the pad PDL for the main transistor is short-circuited. Furthermore, the shorting between the die pad DPL and the source pad SPL for the main transistor caused by the silver paste 60B falling away from the surface of the semiconductor chip CPL onto the die pad DPL can also be suppressed.

Thus, the first technical significance of the feature point in the present embodiment of providing the wall portion 100 so as to surround the main transistor source pad SPL is in that it is possible to suppress the outward protrusion of the main transistor source pad SPL of the silver paste 60B.

Further, since the characteristic point in the present embodiment has not only the first technical significance described above but also the second technical significance described below, this point will be described. Specifically, the feature of the present embodiment has the second technical significance of overcoming the room for improvement existing in the related art in which the "sense ratio" changes depending on the position of the clip.

Figure 15:
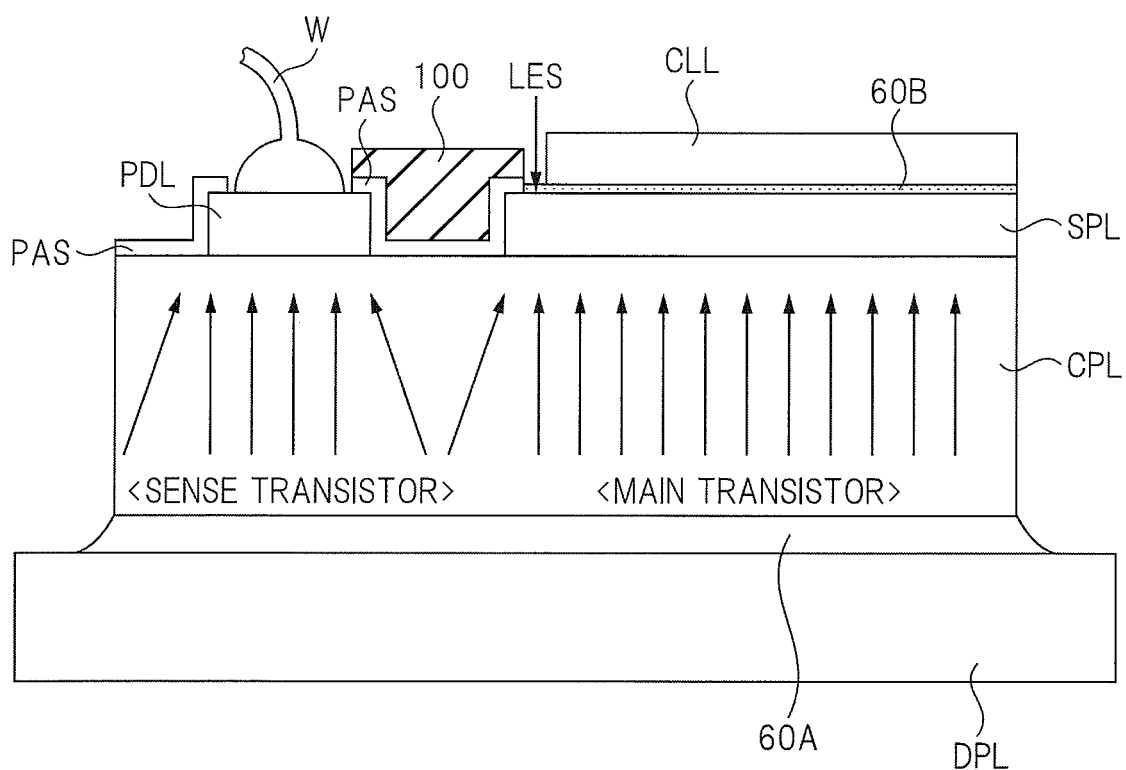
FIG. 15 is a cross-sectional view taken along a line C-C in FIG. 11 and also is a diagram illustrating a configuration in which the clip is disposed being shifted to the left side of the paper plane.

FIG. 15 is a cross-sectional view taken along the line C-C in FIG. 11, and shows a configuration in which the clip CLL is arranged to be shifted to the left side of the drawing. On the other hand, FIG. 16 is a cross-sectional view taken along the line C-C in FIG. 11, and shows a configuration in which the clip CLL is arranged so as to be shifted to the right side in the drawing.

Figure 16:
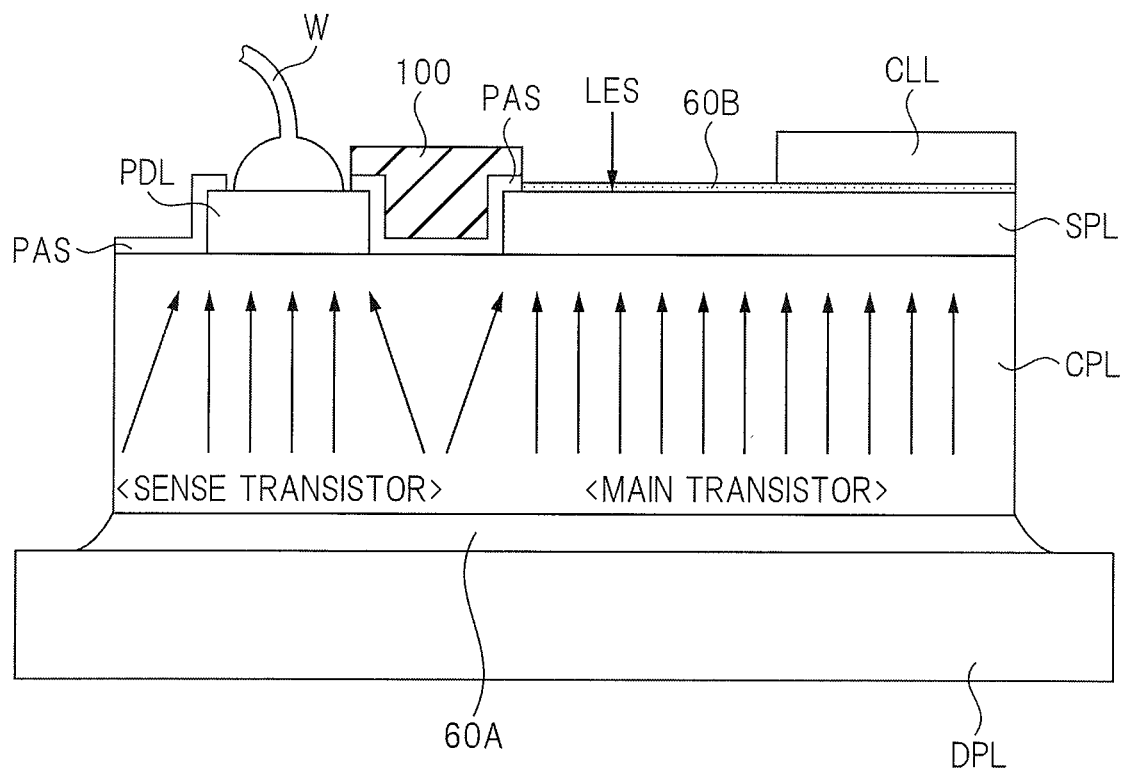
FIG. 16 is a cross-sectional view taken along a line C-C in FIG. 11 and also is a diagram illustrating a configuration in which the clip is disposed being shifted to the right side of the paper plane.

As illustrated in FIGS. 15 and 16, in the present embodiment, even if the position of the clip CLL itself is displaced, unlike the related art (see FIGS. 9 and 10), the entire exposed surface LES of the source pad SPL for the main transistor is covered with the silver paste 60B. Therefore, since the silver paste 60B is present on the entire exposed surface of the source pad SPL for the main transistor, even if the positional deviation of the clip CLL itself occurs, "sense ratio" between the current value of the current flowing through the main transistor and the current value of the current flowing through the sense transistor is not much changed. Because, in any of the configurations of FIGS. 15 and 16, the silver paste 60B themselves remain unchanged to be present throughout the exposed surface of the source pad SPL for the main transistor, thereby, even if displacement occurs in the arrangement position of the clip CLL, it is because the variation of the current path shown in the direction of the arrow in FIGS. 15 and 16 is suppressed.

That is, according to the feature point in the present embodiment, since the wall portion 100 is provided, unlike the related art, it is possible to fill the silver paste 60B on the entire exposed surface of the main transistor source pad SPL surrounded by the wall portion 100. As a result, the silver paste 60B has a function of alleviating a change in the "sense ratio" caused by a positional deviation of the clip CLL itself. In other words, by the silver paste 60B is formed on the entire exposed surface of the source pad SPL for the main transistor, even if the deviation occurs in the arrangement position of the clip CLL, the variation of the current path indicated by the arrow direction in FIGS. 15 and 16 as a result is suppressed, which it is possible to suppress the change in the "sense ratio".

Thus, the feature point in the present embodiment has not only the first technical significance that the outward protrusion of the source pad SPL for the main transistor of the silver paste 60B can be suppressed, but also the second technical significance that the "sense ratio" can be suppressed from changing due to the positional deviation of the clip. From this, it can be said that the technical idea in the present embodiment is a very excellent technical idea in that the room for improvement attributable to the properties of the silver paste itself can be overcome while the silver paste superior to the solder in terms of improvement in connection reliability and reduction in on-resistance is used.

<Method of Manufacturing Semiconductor Device>

Next, a method of manufacturing a semiconductor device in this embodiment mode will be described.

First, after describing the manufacturing process of the semiconductor chip, a description will be given of an assembly step of assembling the manufactured semiconductor chip to a semiconductor device is a package structure.

<<Semiconductor Chip Manufacturing Process>>

First, a semiconductor element including a main transistor and a sense transistor is formed on a semiconductor substrate SUB by using conventional semiconductor manufacturing techniques (patterning technique, ion implantation technique, etching technique, film formation technique, etc.). In this embodiment, already, it is assumed that the semiconductor element is formed on the semiconductor substrate SUB.

Figure 17:
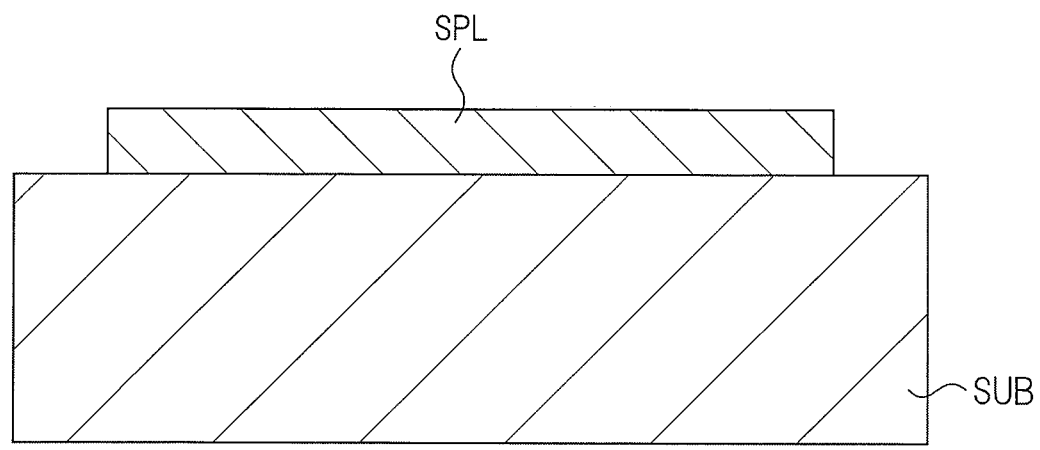
FIG. 17 is a cross-sectional view illustrating a process of manufacturing the semiconductor chip.

Next, as illustrated in FIG. 17, to form a source pad SPL for the main transistor on the surface of the semiconductor substrate SUB. The source pad SPL for the main transistor, for example, by using a sputtering method, after forming an aluminum film on the surface of the semiconductor substrate SUB, can be formed by patterning the aluminum film using a photolithography technique and an etching technique.

Figure 18:
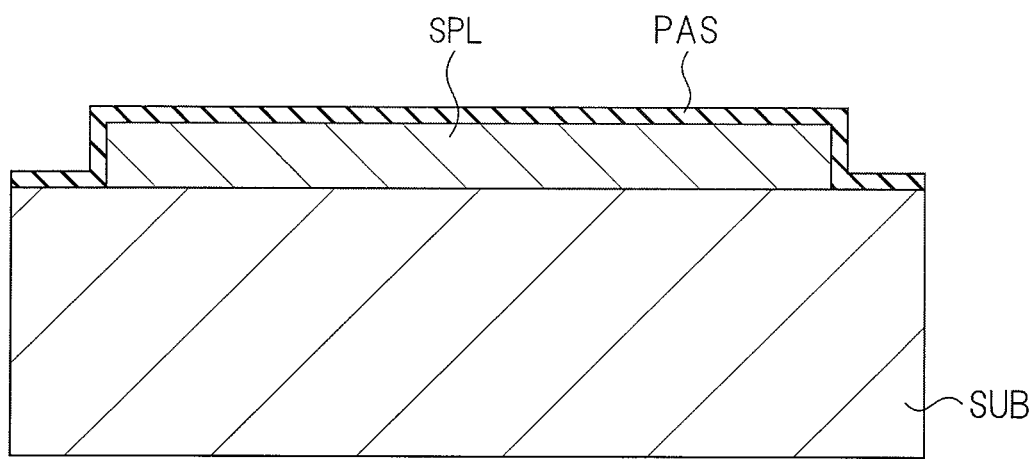
FIG. 18 is a cross-sectional view illustrating a process of manufacturing the semiconductor chip following FIG. 17.

Subsequently, as illustrated in FIG. 18, a passivation film PAS is formed to cover the source pad SPL for the main transistor by using a CVD (Chemical Vapor Deposition) method. The passivation film PAS can be formed of, for example, a single layer film or a laminated film of a silicon oxide film or a silicon nitride film.

Figure 19:
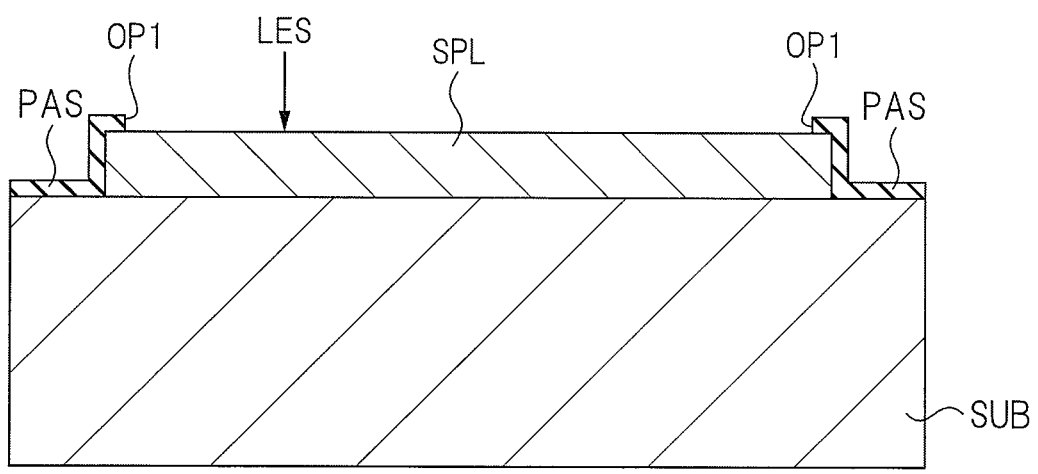
FIG. 19 is a cross-sectional view illustrating a process of manufacturing the semiconductor chip following FIG. 18.

Thereafter, as illustrated in FIG. 19, an opening OP1 is formed in the passivation film PASS by using photolithography techniques and etching techniques. At this time, from the opening OP1, a portion of the surface of the source pad SPL for the main transistor is exposed.

Figure 20:
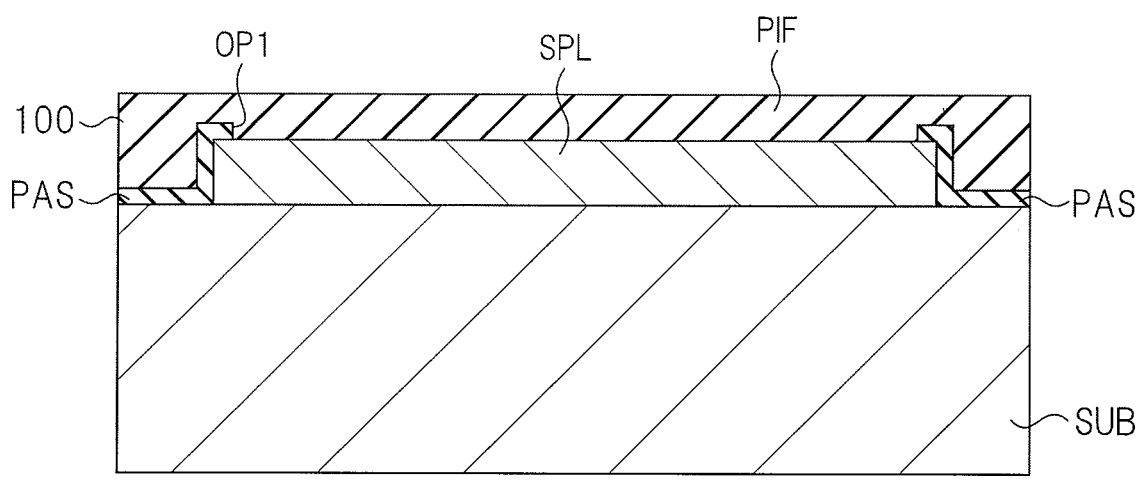
FIG. 20 is a cross-sectional view illustrating a process of manufacturing the semiconductor chip following FIG. 19.
Figure 21:
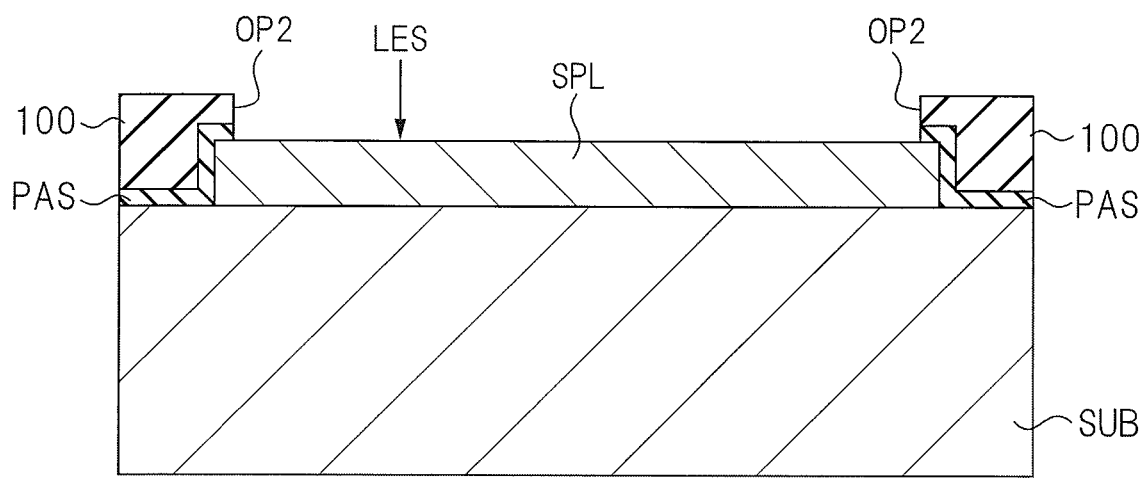
FIG. 21 is a cross-sectional view illustrating a process of manufacturing the semiconductor chip following FIG. 20.

Then, as illustrated in FIG. 20, a polyimide resin film PIF is coated on the passivation film PAS including the inside of the opening OP1. Next, as illustrated in FIG. 21, the polyimide resin film PIF is processed by using a photolithography technique and an etching technique. As a result, an opening OP2 exposing most of the main transistor source pad SPL can be formed in the polyimide film PIF, and the wall portion 100 is formed in the polyimide film PIF.

Thereafter, singulation is performed by dicing the chip region of the semiconductor substrate SUB (semiconductor wafer). Thus, a plurality of semiconductor chips can be obtained. As described above, the semiconductor chip according to the present embodiment can be manufactured.

<<Semiconductor Device Assembly Process>>

Next, the assembly process of the semiconductor device is described.

Figure 22:
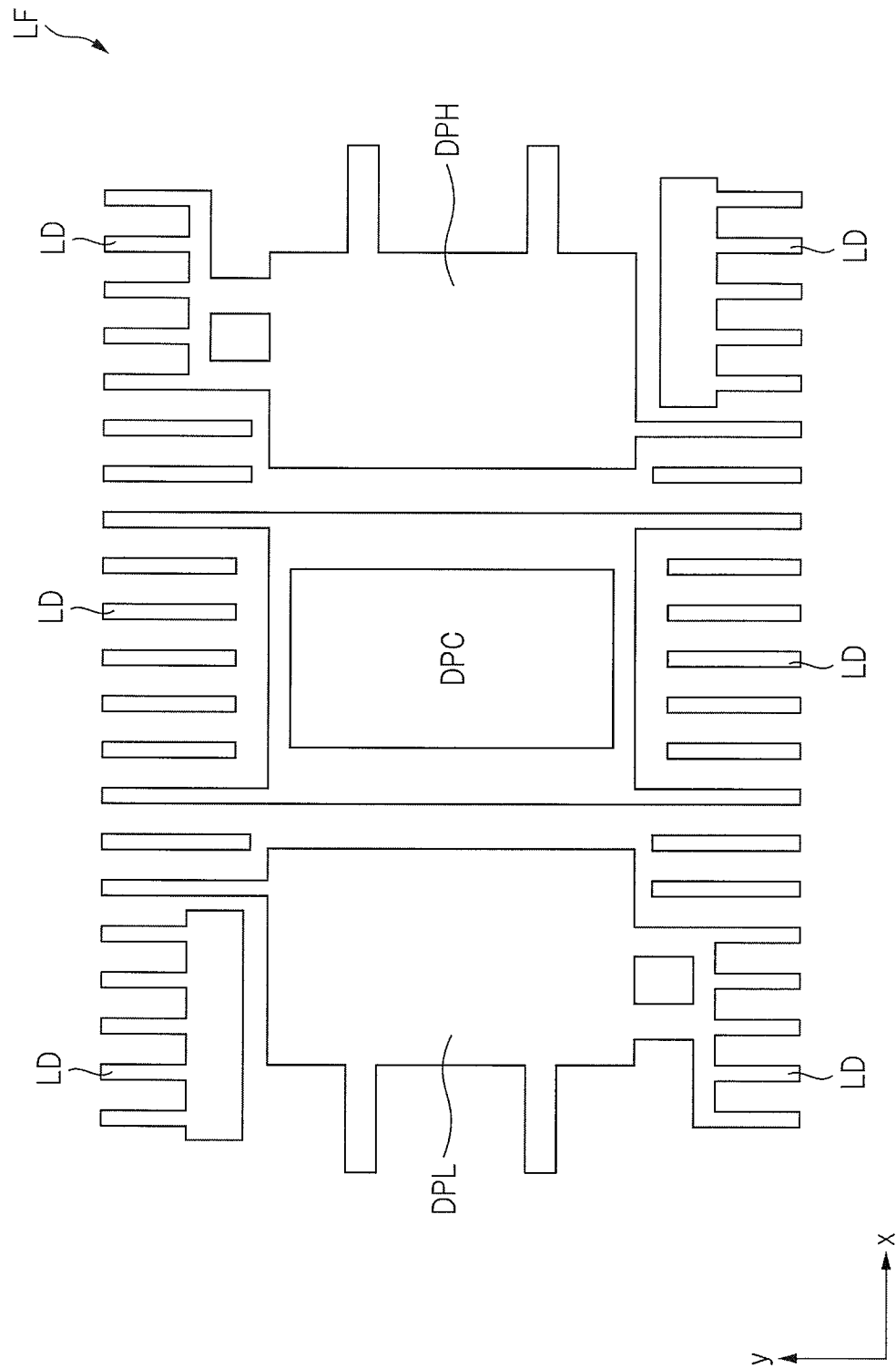
FIG. 22 is a plan view illustrating a process of manufacturing the semiconductor device.

First, as illustrated in FIG. 22, a lead frame LF is prepared.

The lead frame LF is provided with a plurality of lead LD, die pad DPL, die pad DPC and die pad DPH.

Figure 23:
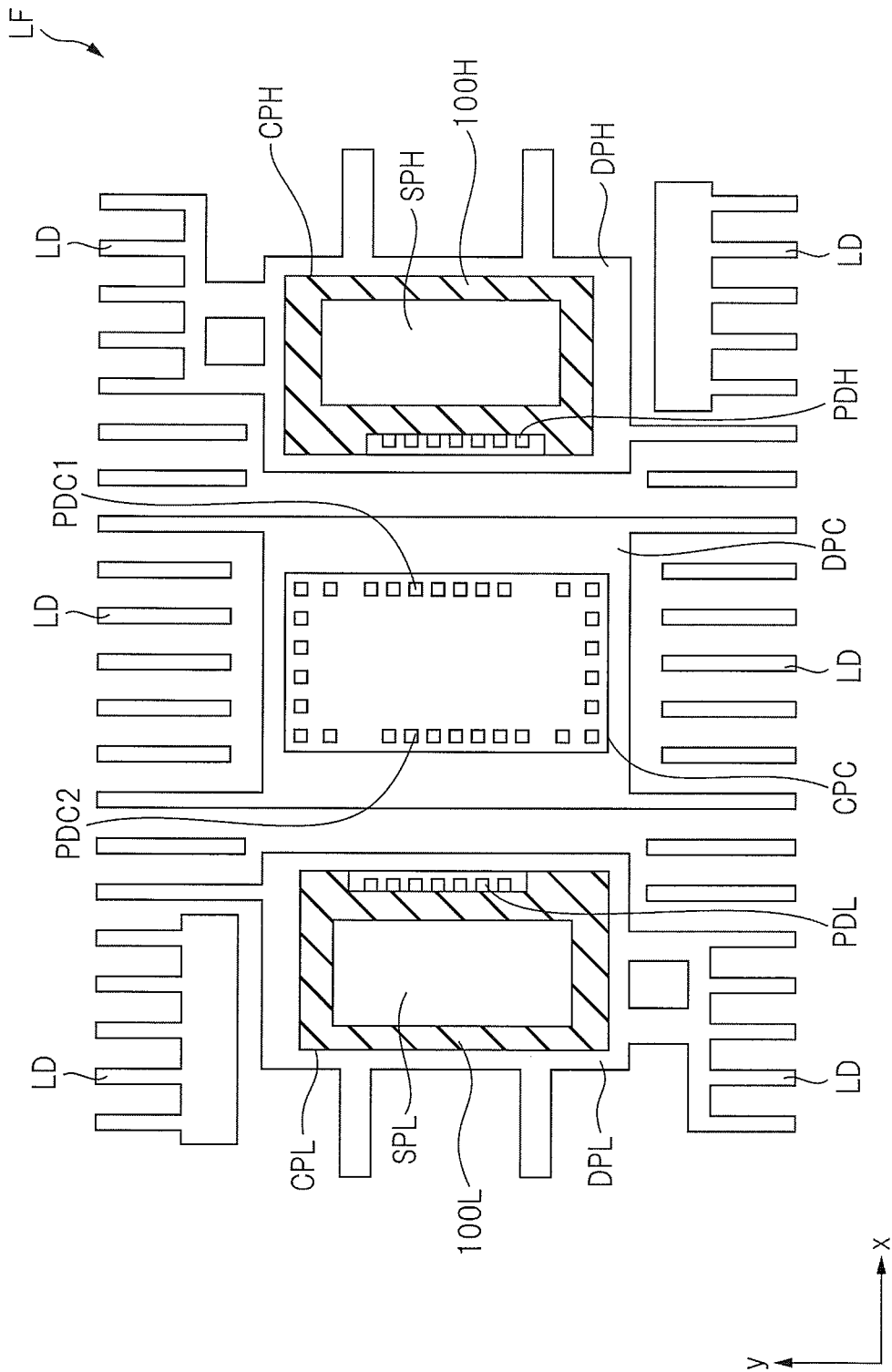
FIG. 23 is a plan view illustrating a process of manufacturing the semiconductor device following FIG. 22.

Subsequently, as illustrated in FIG. 23, after applying silver paste on the die pad DPL, the semiconductor chip CPL is mounted on the die pad DPL on the die pad DPC and on the die pad DPH, the semiconductor chip CPC is mounted on the die pad DPC, and the semiconductor chip CPH is mounted on the die pad DPH. At this time, the low-side switching circuit 20 illustrated in FIG. 2 is formed on the semiconductor chip CPL, the control circuit 30 illustrated in FIG. 2 is formed on the semiconductor chip CPC, and the high-side switching circuit 10 illustrated in FIG. 2 is formed on the semiconductor chip CPH.

On the surface of the semiconductor chip CPL, a main transistor source pad SPL, a plurality of pads PDL, and a wall portion 100L surrounding the main transistor source pad SPL are formed. Similarly, on the surface of the semiconductor chip CPH, a source pad SPH for a main transistor, a plurality of pads PDH, and a wall portion 100H surrounding the source pad SPH for a main transistor are formed. On the other hand, on the surface of the semiconductor chip CPC, a plurality of pads including a plurality of pads PDC1 and a plurality of pads PDC2 are formed.

Figure 24:
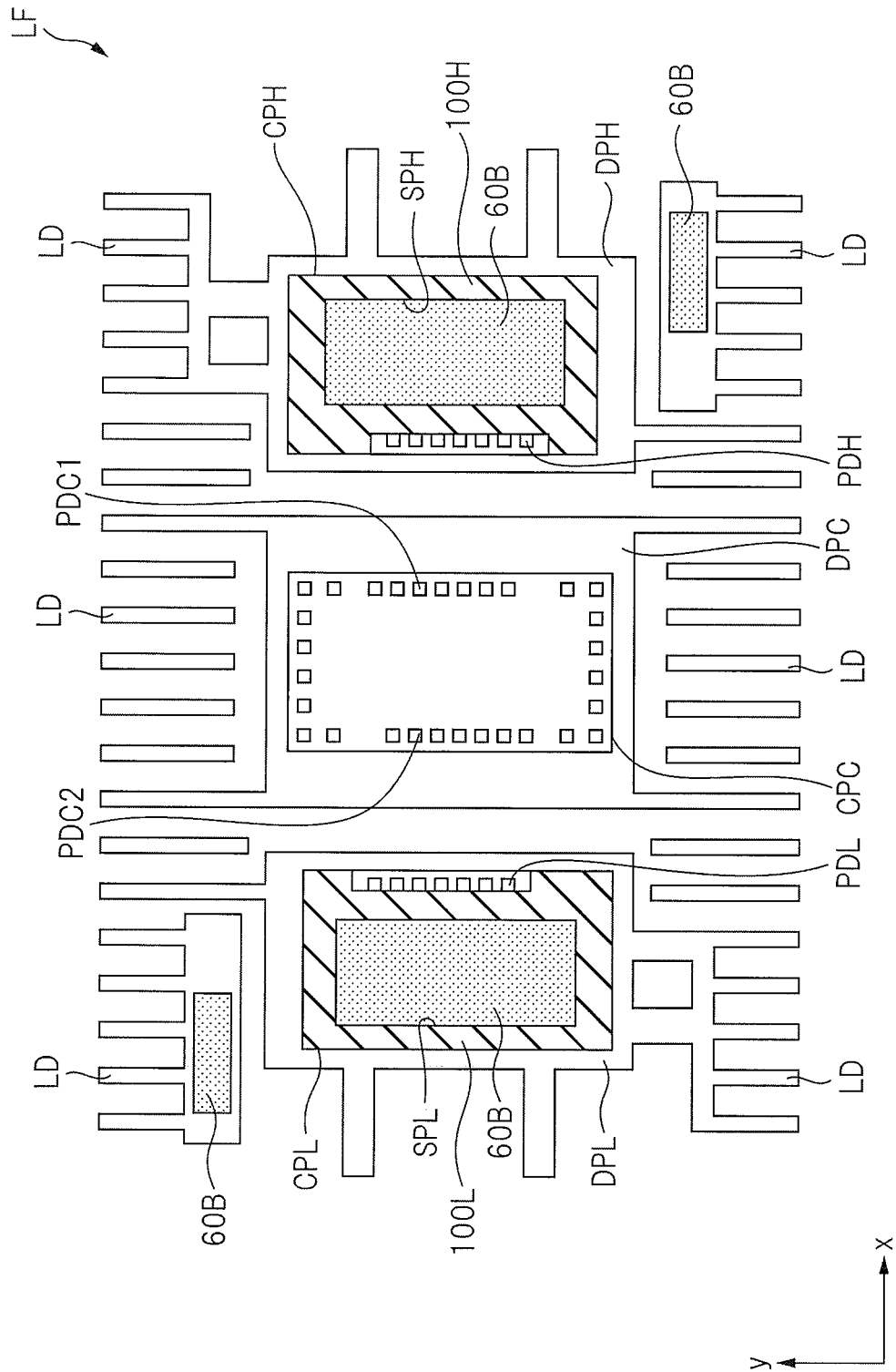
FIG. 24 is a plan view illustrating a process of manufacturing of the semiconductor device following FIG. 23.

Next, as illustrated in FIG. 24, with applying a silver paste 60B on the source pad SPL for the main transistor of the semiconductor chip CPL, applying a silver paste 60B on the source pad SPH for the main transistor of the semiconductor chip CPH.

At this time, since the wall portion 100L is formed so as to surround the main transistor source pad SPL, it is possible to suppress the silver paste 60B from protruding outward from the main transistor source pad SPL. Thus, in the semiconductor chip CPL, it is possible to prevent short-circuiting between the main transistor source pad SPL and the pad PDL via the silver paste 60B.

Similarly, since the wall portion 100H is formed so as to surround the main transistor source pad SPH, it is possible to suppress the silver paste 60B from protruding outward from the main transistor source pad SPH. Thus, even in the semiconductor chip CPH, it is possible to prevent short-circuiting between the main transistor source pad SPH and the pad PDH via the silver paste 60B.

Figure 25:
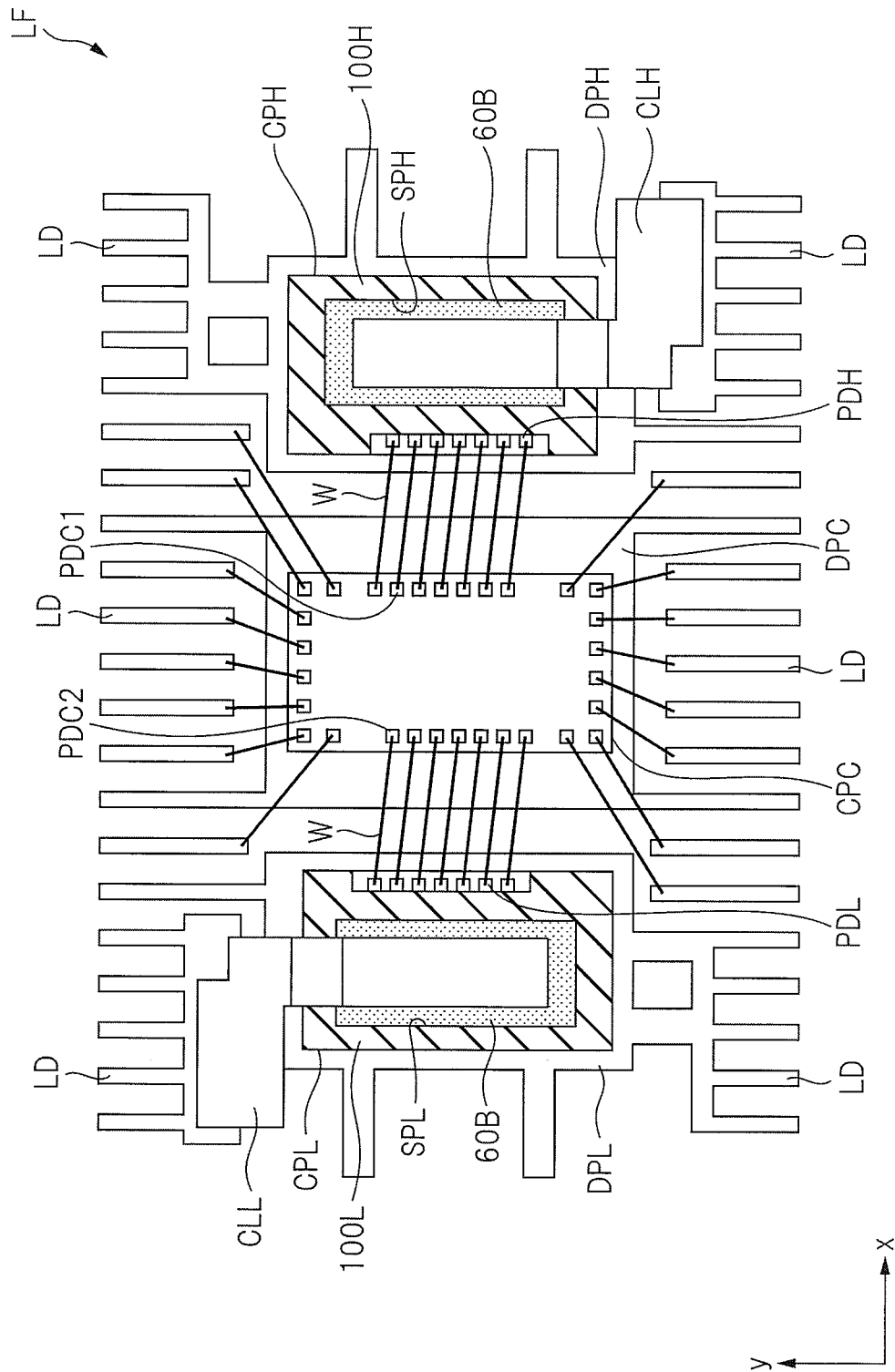
FIG. 25 is a plan view illustrating a process of manufacturing of the semiconductor device following FIG. 24.

Subsequently, as illustrated in FIG. 25, a clip CLL is mounted on the source pad SPL for the main transistor through a silver paste 60B, and the clip CLL and the lead LD are connected. Similarly, the clip CLH is mounted on the source pad SPH for the main transistor, and the clip CLH and the lead LID are connected to each other.

The pad PDL and the pad PDC2 are connected by a bonding wire W, and the pad PDH and the pad PDC1 are connected by the bonding wire W.

Figure 26:
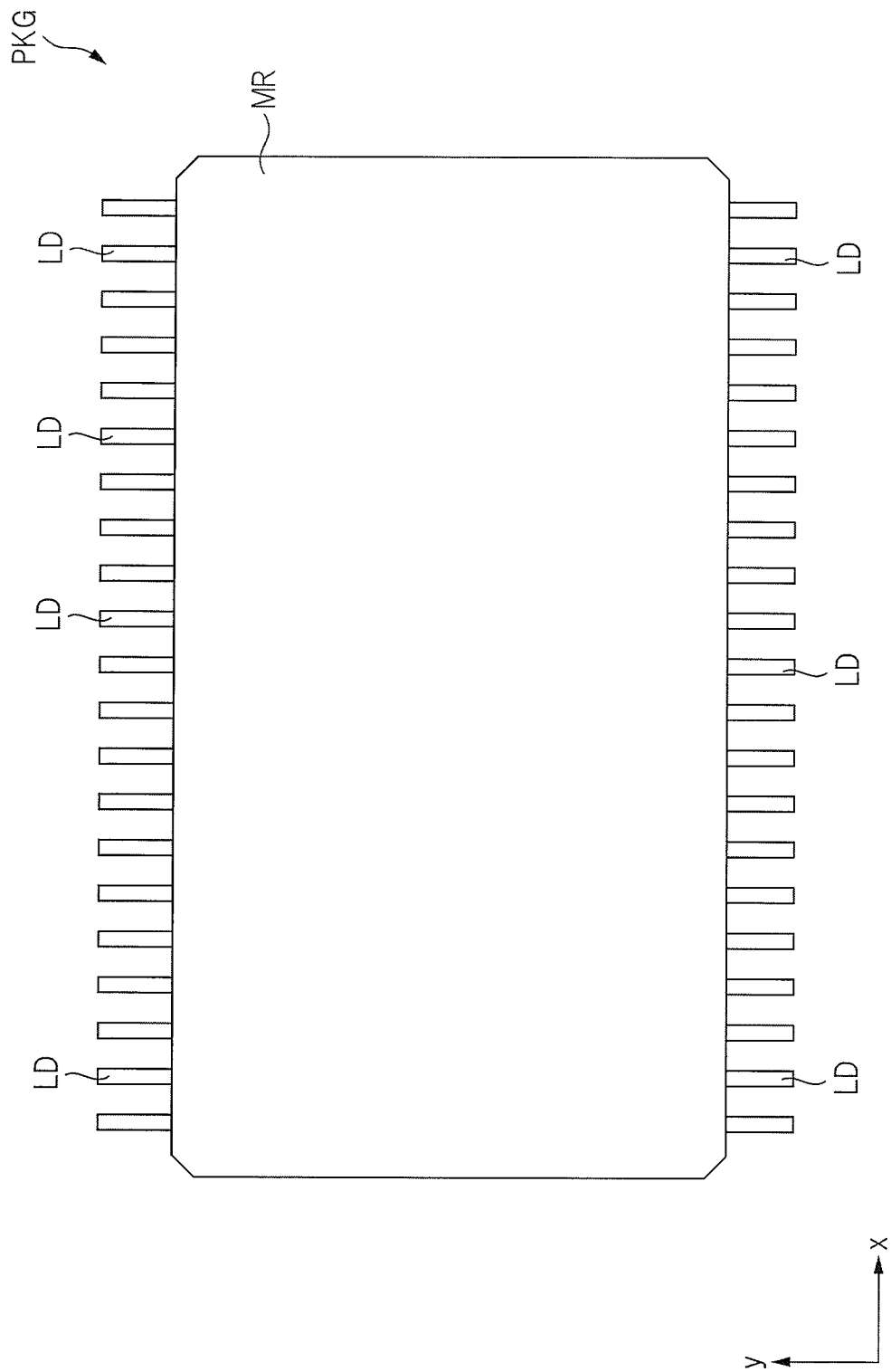
FIG. 26 is a plan view illustrating a process of manufacturing of the semiconductor device following FIG. 25.

Thereafter, as illustrated in FIG. 26, to form a sealing body MR by performing resin sealing. Then, a plating layer (not shown) is formed on the outer lead portion of the lead LD exposed from the sealing body MR as necessary. Next, outside the sealing body MR, the lead LD is cut at a predetermined position to separate the sealing body MR from the frame of the lead frame LF. Subsequently, the outer lead portion of the lead LD protruding from the sealing body MR is bent.

As described above, the semiconductor device PKG can be manufactured.

<First Modification>

Next, a first modification of the above embodiment will be described.

Figure 27:
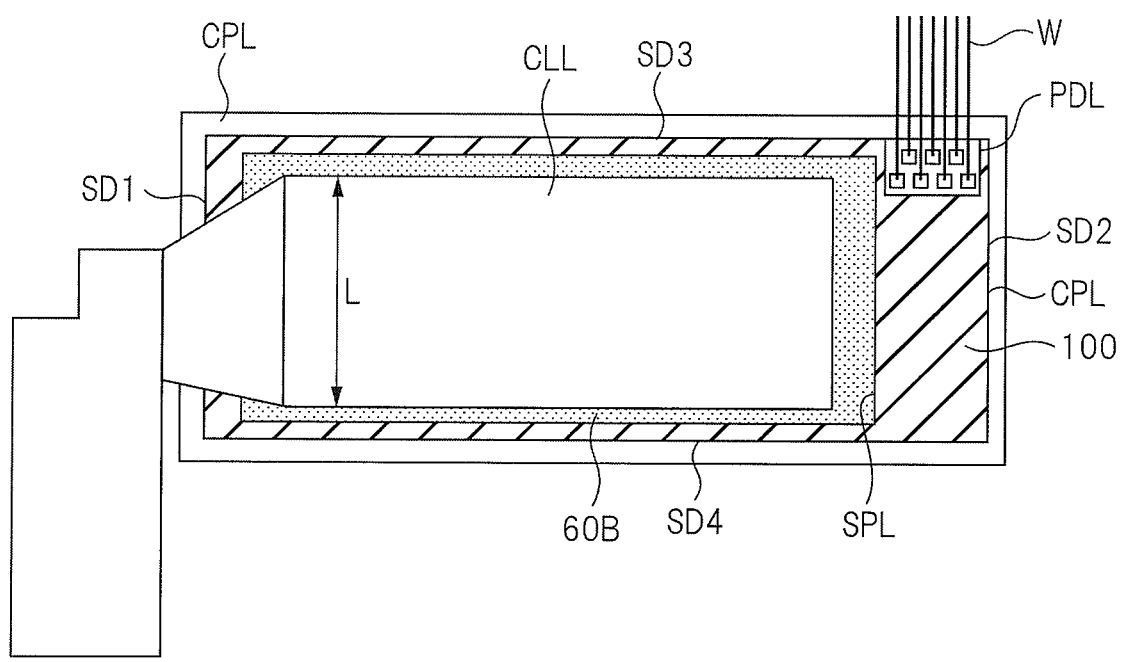
FIG. 27 is a schematic view illustrating a configuration of a first modification.

FIG. 27 is a schematic diagram illustrating the configuration of the first modification.

In FIG. 27, the semiconductor-chip CPL includes a side SD1, a side SD2 facing the side SD1, a side SD3 crossing to each of the side SD1 and the side SD2, and a side SD4 facing the side SD3. At this time, the clip CLL has an extraction portion crossing to the side SD1, and the pads PDL formed on the surface of the semiconductor chip CPL are collectively arranged at an intersecting portion (corner portion) between the side SD2 and the side SD3 of the semiconductor chip CPL.

Thus, according to this first modification, without being obstructed by the plurality of pads PDL, it is possible to increase the width in the y-direction of the main transistor source pad SPL and the width in the y-direction of the clip CLL shown by "L" in FIG. 27. This means that the width in the y-direction of the extraction portion of the clip CLL near the lead can be increased, and therefore, according to the first modification, the effect of reducing the on-resistance caused by the clip CLL can be obtained.

<Second Modification>

Subsequently, a second modification of the above embodiment will be described.

Figure 28:
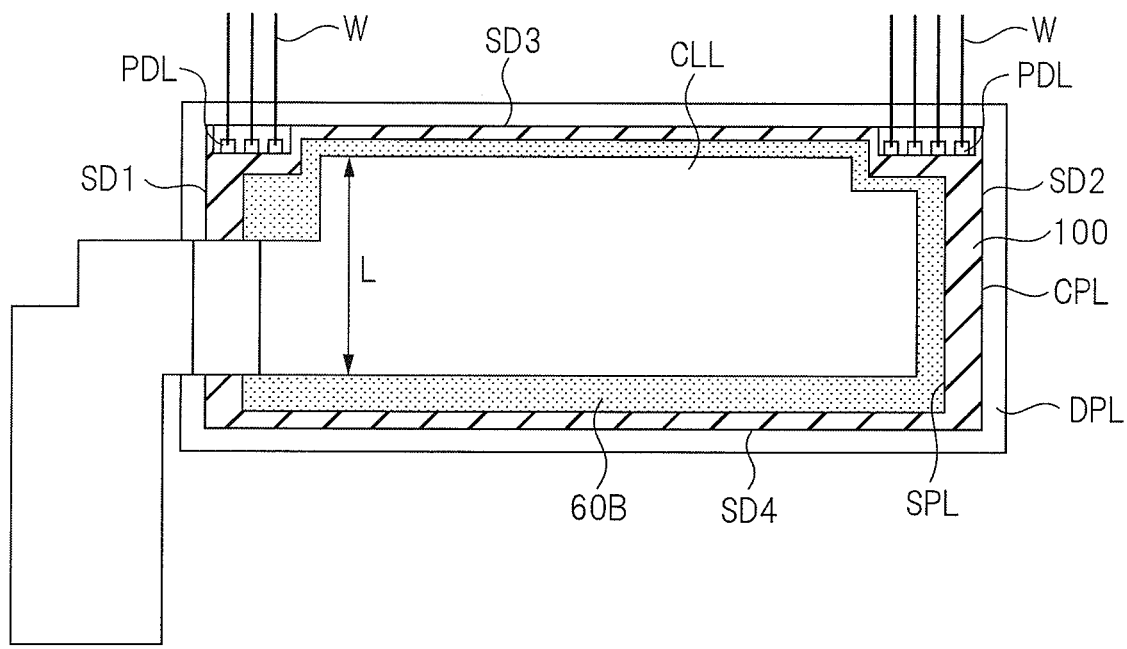
FIG. 28 is a schematic view illustrating a configuration of a second modification.

FIG. 28 is a schematic diagram illustrating the configuration of the second modification.

In FIG. 28, the semiconductor-chip CPL includes a side SD1, a side SD2 facing the side SD1, a side SD3 crossing the side SD1 and the side SD2, and a side SD4 facing the side SD3. At this time, the clip CLL has an extraction portion crossing to the side SD1. On the other hand, the plurality of pads PDL formed on the surface of the semiconductor chip CPL are composed of a first pad group (three pads PDL on the left side in the drawing) and a second pad group (four pads PDL on the right side in the drawing). The first pad group is arranged at the intersecting portion of the side SD1 and the side SD3, while the second pad group is arranged at the intersecting portion of the side SD2 and the side SD3.

Thus, even in this second modification, without being obstructed by a plurality of pads PDL, but not as much as in the first modification, it is possible to increase width in the y-direction of source pad SPL the main transistor and the width in the y-direction of the clip CLL shown by "L" in FIG. 28. This means that the width in the y-direction of the clip CLL can be increased, and therefore, according to the second modification, an effect that the on-resistance caused by the clip CLL can be reduced can also be obtained.

<Third Modification>

Next, a third modification of the above embodiment will be described.

Figure 29:
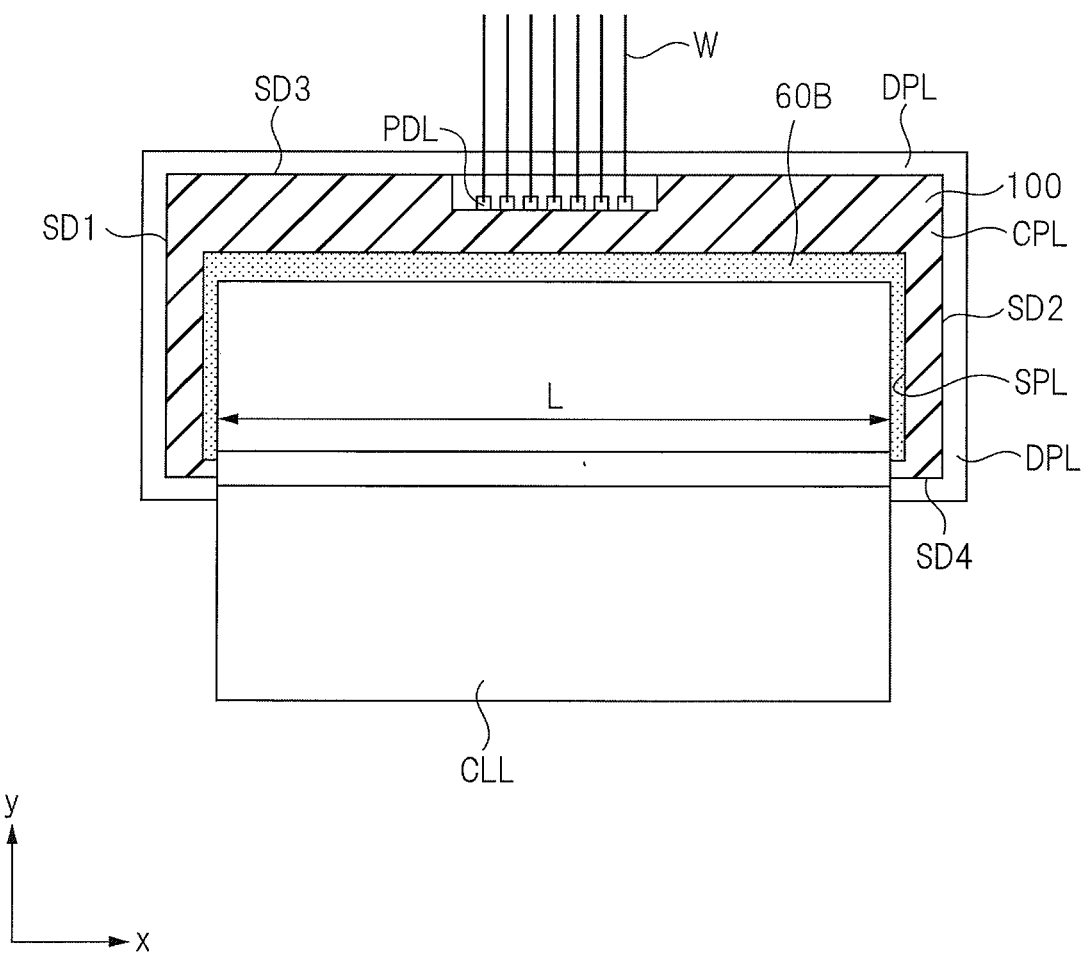
FIG. 29 is a schematic view illustrating a configuration of a third modification.

FIG. 29 is a schematic diagram illustrating the configuration of the third modification.

In FIG. 29, the semiconductor chip CPL, in the plan view, is composed of a rectangular shape. Then, the semiconductor chip CPL includes a side SD1 is a short side, and a side SD2 facing a side SD3 is a long side intersecting the side SD1 and the side SD2, and a side SD4 facing the side SD3. At this time, the clip CLL has an extraction portion intersecting with the side SD4 which is the long side. As a result, in the third modification, the width in the x direction (the width of the extraction portion) of the clip CLL indicated by "L" in FIG. 29 can be made larger than that in the first modification and the second modification. As a result, according to the third modification, it is possible to increase the potential to reduce the on-resistance caused by the clip CLL.

<Fourth Modification>

Next, a fourth modification of the above embodiment will be described.

Figure 30:
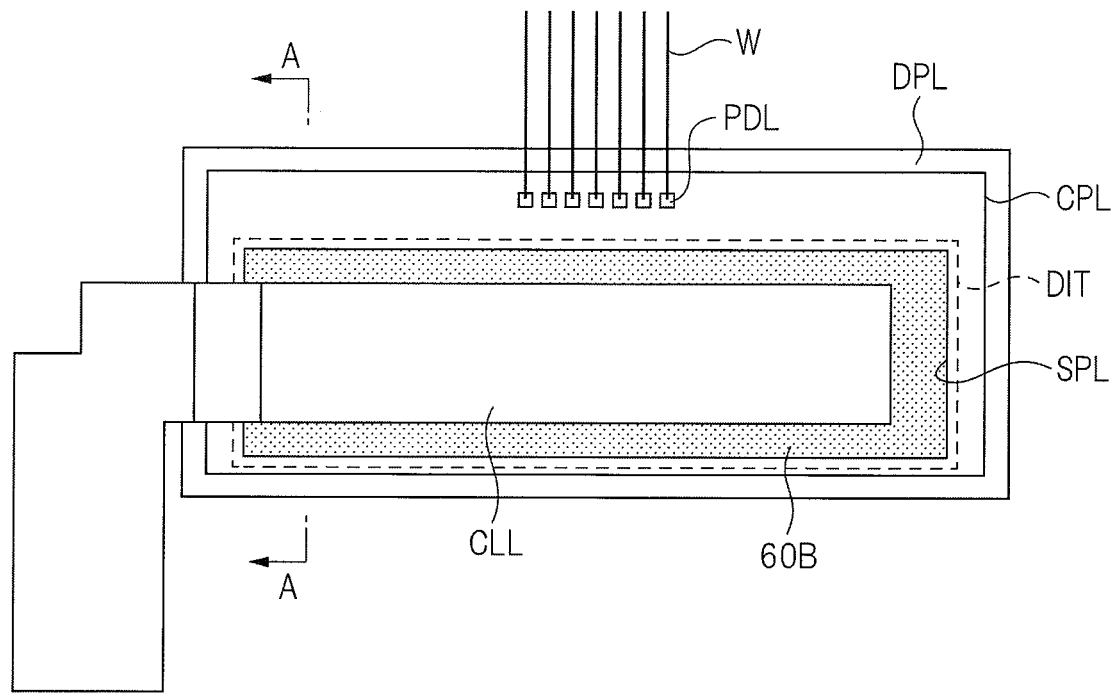
FIG. 30 is a schematic view illustrating a configuration of a fourth modification.

FIG. 30 is a schematic diagram illustrating the configuration of the fourth modification.

In FIG. 30, the surface of the semiconductor chip CPL, the source pad SPL for the main transistor is formed, in the plan view, the groove DIT is provided so as to surround the source pad SPL for the main transistor.

Figure 31:
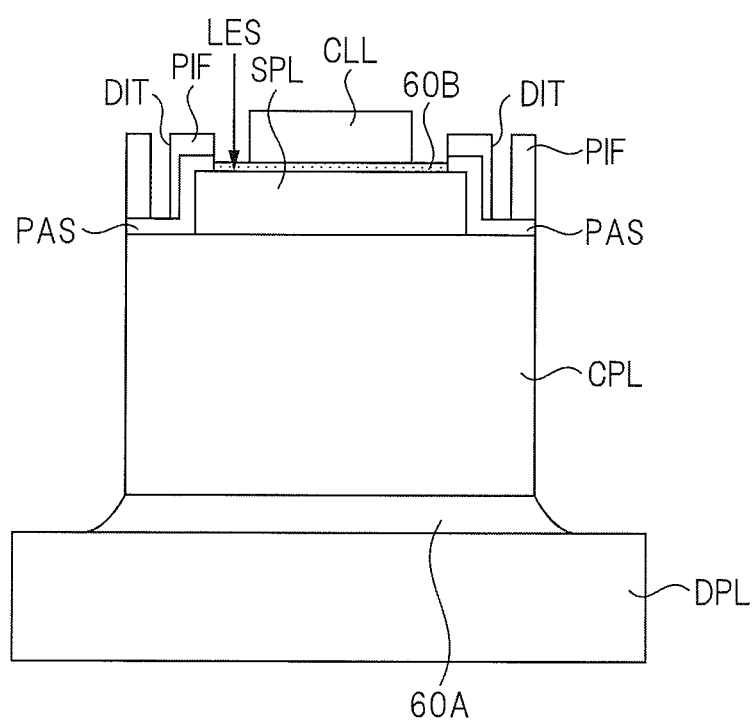
FIG. 31 is a cross-sectional view taken along a line A-A in FIG. 30.

FIG. 31 is a cross-sectional view taken along a line A-A in FIG. 30.

In FIG. 31, the surface of the semiconductor chip CPL, the passivation film PAS having an opening is formed, a portion of the source pad SPL for the main transistor is exposed from the opening. A silver paste 60B is formed on the exposed main-transistor source pad SPL, and the clip CLL is mounted on the silver paste 60B. On the other hand, a polyimide resin film PIF is formed on the passivation film PAS, and a groove DIT is formed on the polyimide resin film PIF. The groove DIT is configured to suppress the flow of the silver paste 60B to the outer side of the groove DIT.

According to the fourth modification configured as described above, the same effect as that of the above-described embodiment in which the wall portion 100 is provided can be obtained. That is, the groove DIT in the fourth modification is a component corresponding to the wall portion 100 in the embodiment, by the groove DIT, it is possible to suppress the protrusion of the silver paste 60B to the outside of the groove DIT, the position of the clip it is also possible to suppress the "sense ratio" is changed.

The invention made by the present inventor has been described above in detail based on the embodiment, but the present invention is not limited to the embodiment described above, and it is needless to say that various modifications can be made without departing from the gist thereof.

For example, in the above-described embodiment, it has been described that the respective planar shape of the semiconductor device PKG and each semiconductor chip is rectangular, the planar shape of each semiconductor chip, depending on its size, the planar shape of the semiconductor device PKG may be square.

Figure 32:
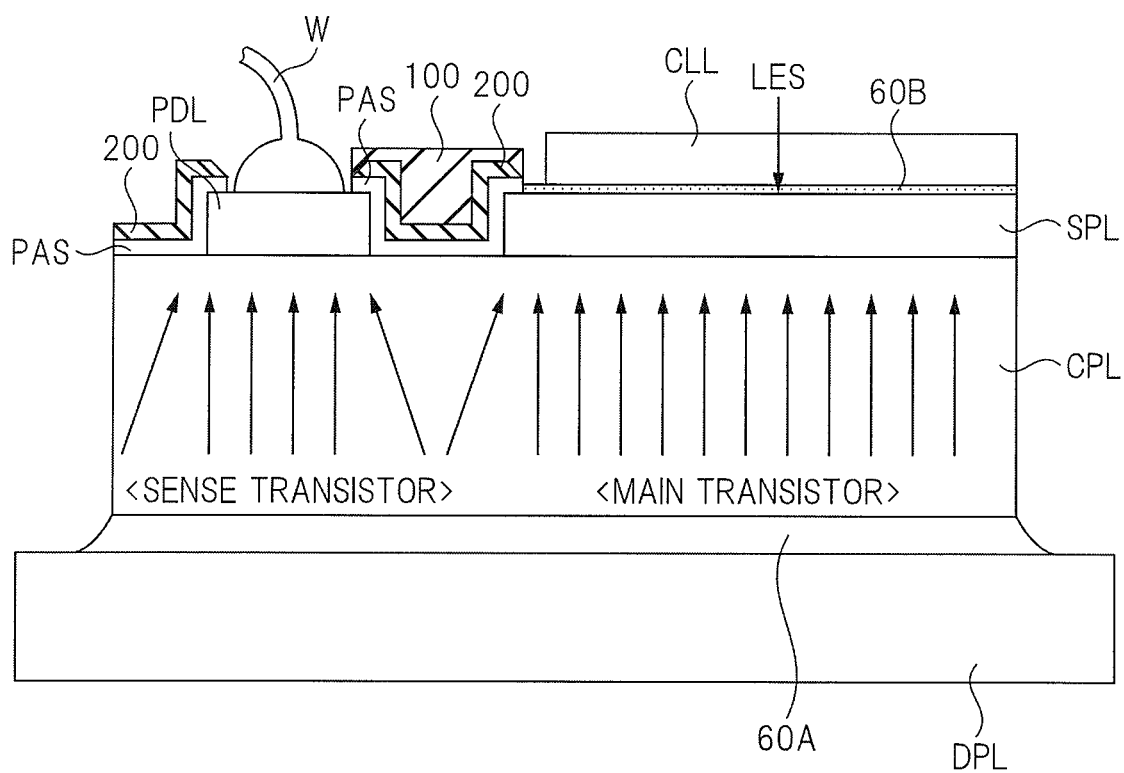
FIG. 32 is a schematic view illustrating a configuration of a fifth modification.

Further, in the semiconductor device PKG of the above embodiment, although it has been described that 1) silicon oxide film, 2) silicon nitride film, or 3) passivation film consisting of a laminated film of a silicon oxide film and a silicon nitride film (i.e., an inorganic insulating film) is formed on the wall portion 100, as illustrated in FIG. 32 (Modified Example 5), between the wall portion 100 and the passivation film PAS, further, for example, an organic insulating film 200 such as a polyimide resin film may be interposed. Incidentally, the organic insulating film 200 interposed between the wall portion 100 and the passivation film PAS is formed in a step separate from the step of forming the wall portion 100. The thickness of the organic insulating film 200 interposed between the wall portion 100 and the passivation film PAS is, for example, about 10 μm. Therefore, in the case of a polyimide resin film having such a film thickness, there is a fear that the silver paste applied on the source pad protrudes from the source pad. This is because it is necessary to use a sufficient amount of silver paste in order to surely cover the entire exposed surface of the source pad with the silver paste, and in this case, the thickness of the applied silver paste is larger than 10 μm, which is the thickness of the organic insulating film 200. As a result, if the organic insulating film 200 is simply formed on the passivation film PAS, the silver paste having high fluidity may protrude from the source pad. On the other hand, since the thickness of the wall portion 100 in this embodiment is sufficiently larger than the respective thicknesses of the organic insulating film 200 and the silver paste to be supplied, the extrusion of the silver paste supplied on the source pad can be suppressed.

What is claimed is:

1. A semiconductor device comprising:
a chip mounting portion;
a semiconductor chip mounted on the chip mounting portion, the semiconductor chip including:
a passivation film having an opening;
a first pad having a portion exposed from the passivation film at the opening; and
a wall portion provided on the passivation film so as to surround the first pad in a plan view; and
a clip connected to the first pad of the semiconductor chip via a first silver paste,
wherein, in a cross-sectional view, a thickness of the wall portion is larger than a thickness of the passivation film,
wherein a whole of the portion of the first pad, which is exposed from the passivation film, is covered with the first silver paste, and
wherein, in the plan view, the first silver paste connecting the clip to the first pad is positioned inside of an area surrounded by the wall portion.

2. The semiconductor device according to claim 1, wherein the first silver paste is in contact with the wall portion.

3. The semiconductor device according to claim 1,
wherein the first pad and a second pad that is different from the first pad are provided on a surface of the semiconductor chip, and
wherein the first pad and the second pad are separated by the wall portion in the plan view.

4. The semiconductor device according to claim 3, wherein the wall portion has a portion overlapping each of the second pad in the plan view.

5. The semiconductor device according to claim 3, wherein a bonding wire is connected to the second pad.

6. The semiconductor device according to claim 3,
wherein the semiconductor chip is formed with:
a main transistor through which a current is flowing; and
a sense transistor provided for detecting a current value of the current,
wherein the first pad is a source pad of the main transistor, and
wherein the second pad is a source pad of the sense transistor.

7. The semiconductor device according to claim 6, wherein each of the main transistor and the sense transistor is a vertical trench power transistor through which the current is flowing in a thickness direction of the semiconductor chip.

8. The semiconductor device according to claim 3,
wherein the semiconductor chip includes:
a first side crossing to an extraction portion of the clip in the plan view,
a second side facing the first side;
a third side crossing to the first side and the second side; and
a fourth side facing the third side.

9. The semiconductor device according to claim 8, wherein the second pad is disposed at an intersecting portion of the second side and the third side.

10. The semiconductor device according to claim 8,
wherein a surface of the semiconductor chip is provided with the first pad, the second pad, and a third pad that is different from each of the first pad and the second pad,
wherein a first pad group including the second pad is disposed at an intersecting portion of the first side and the third side, and
wherein a second pad group including the third pad is disposed at an intersecting portion of the second side and the third side.

11. The semiconductor device according to claim 3,
wherein a shape of the semiconductor chip in the plan view is a rectangle,
wherein the semiconductor chip includes:
a first side which is a short side;
a second side facing the first side;
a third side which is a long side which crossing to each of the first side and the second side; and
a fourth side facing the third side, and
wherein the fourth side crosses an extraction portion of the clip in the plan view.

12. The semiconductor device according to claim 1, wherein the wall portion is comprised of an organic insulating film.

13. The semiconductor device of claim 1, wherein the clip is made of copper.

14. The semiconductor device according to claim 1, wherein the thickness of the wall portion is greater than 10 μm and 90 μm or less.

15. The semiconductor device according to claim 1,
wherein the semiconductor chip further includes an organic insulating film provided on the passivation film,
wherein the wall portion is provided on the organic insulating film, and
wherein the thickness of the wall portion is larger than the thickness of each of the passivation film and the organic insulating film in the cross-sectional view.

16. The semiconductor device according to claim 15, wherein the thickness of the wall portion is greater than 10 μm and 90 μm or less.

17. The semiconductor device according to claim 16, wherein the wall portion is comprised of an organic insulating film.

* * * * *